(12) United States Patent
Sato

(10) Patent No.: US 12,300,562 B2
(45) Date of Patent: May 13, 2025

(54) SEMICONDUCTOR MODULE AND SEMICONDUCTOR APPARATUS

(71) Applicant: FUJI ELECTRIC CO., LTD., Kawasaki (JP)

(72) Inventor: Yushi Sato, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 259 days.

(21) Appl. No.: 17/677,582

(22) Filed: Feb. 22, 2022

(65) Prior Publication Data

US 2022/0328665 A1    Oct. 13, 2022

(30) Foreign Application Priority Data

Apr. 12, 2021 (JP) ................. 2021-067071

(51) Int. Cl.
| | |
|---|---|
| H01L 23/31 | (2006.01) |
| H01L 23/36 | (2006.01) |
| H01L 23/433 | (2006.01) |
| H01L 23/495 | (2006.01) |
| H01L 29/739 | (2006.01) |

(52) U.S. Cl.
CPC ........ H01L 23/315 (2013.01); H01L 23/3121 (2013.01); H01L 23/36 (2013.01); H01L 23/4334 (2013.01); H01L 23/49558 (2013.01); H01L 29/7395 (2013.01)

(58) Field of Classification Search
None
See application file for complete search history.

(56) References Cited

U.S. PATENT DOCUMENTS

| | | |
|---|---|---|
| 5,672,910 A | 9/1997 | Majumdar et al. |
| 2020/0091025 A1* | 3/2020 | Ichimura ................. H01L 21/52 |
| 2021/0166985 A1* | 6/2021 | Fuji ................... H01L 23/49575 |

FOREIGN PATENT DOCUMENTS

| | | | |
|---|---|---|---|
| JP | 9-153574 | 6/1997 | |
| JP | 2004-39700 | 2/2004 | |
| JP | 2020-53611 | 4/2020 | |
| WO | WO-2020045274 A1 * | 3/2020 | ......... H01L 23/3107 |

* cited by examiner

*Primary Examiner* — Robert G Bachner
*Assistant Examiner* — Molly K Reida

(57) ABSTRACT

A semiconductor module includes: a first power semiconductor element that includes a first main current electrode; a main body that accommodates therein the first power semiconductor element; and a first main current terminal connectable to the first main current electrode. The main body includes: a top face; a side face that connects to the top face; a bottom face fixable to a cooler; and a recessed portion that is on the side face, and accommodates therein an end portion of an insulating member. The first main current terminal protrudes from the side face of the main body, and includes: a first face; and a second face on an opposite side of the first face. The second face is closer to the bottom face than the first face on the side face. The recessed portion is on the side face between the bottom face and the second face, and is at a position apart from the bottom face.

19 Claims, 15 Drawing Sheets

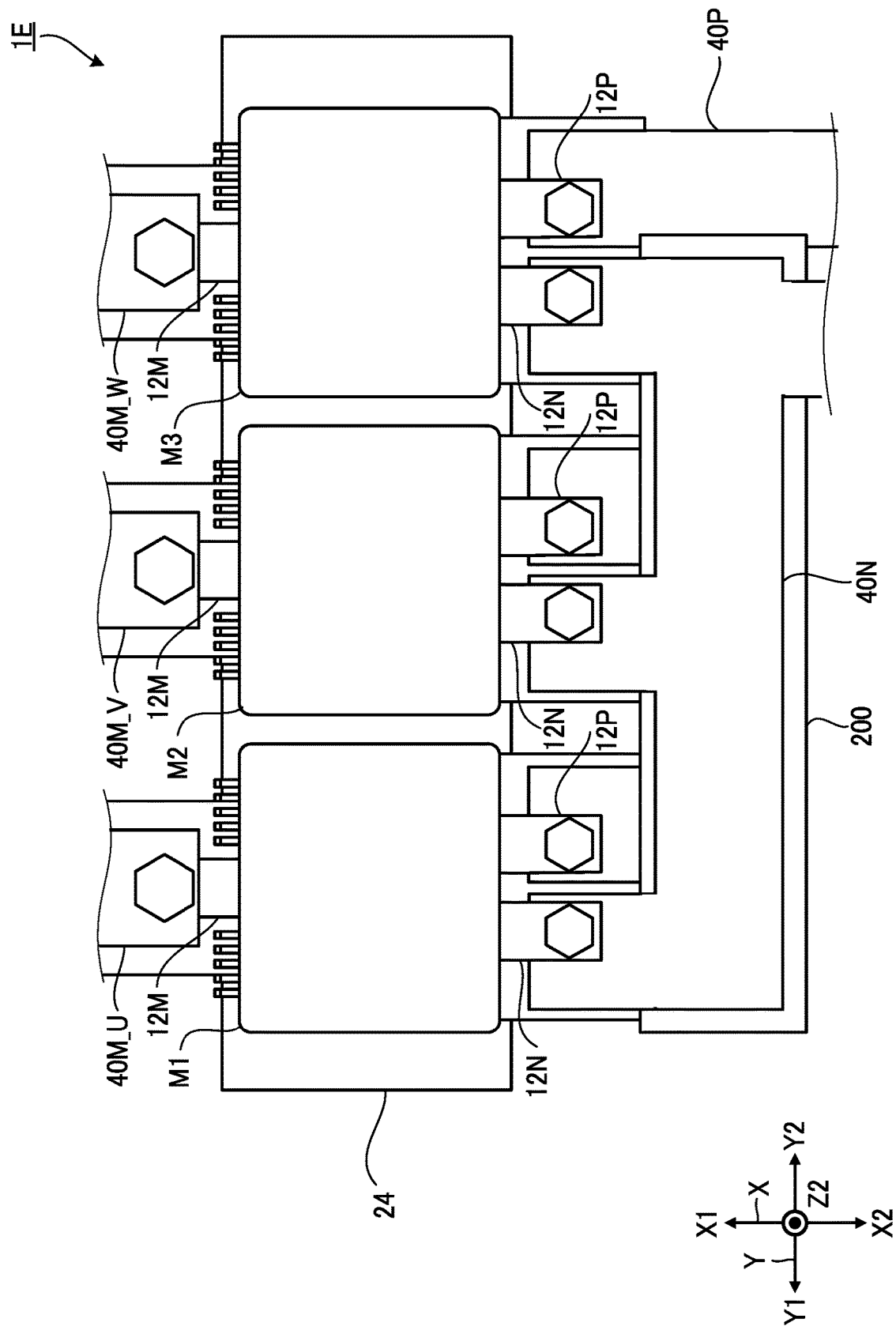

SEMICONDUCTOR MODULE AND SEMICONDUCTOR APPARATUS

CROSS REFERENCE TO RELATED APPLICATION

This application claims priority from Japanese Patent Application No. 2021-067071, filed Apr. 12, 2021, the entire contents of which are incorporated herein by reference.

BACKGROUND

Field of the Invention

The present disclosure relates to semiconductor modules and to semiconductor apparatuses.

Description of Related Art

A power semiconductor module for controlling an electric motor or other apparatuses has been conventionally known. The power semiconductor module accommodates a power semiconductor element therein to be used for high-current switching. Lead terminals of the power semiconductor module often protrude from the side face of the main body of the power semiconductor module. Since the power semiconductor element generates heat during operation, usually the power semiconductor module is used in combination with a cooler attached thereto. It is necessary to ensure a certain insulation distance, such as a spatial distance and a creepage distance, between the cooler and the lead terminals.

Japanese Patent Application Laid-Open Publication No. 2020-53611 discloses a technique for a power semiconductor module to coat a portion of each of lead terminals protruding from the main body with resin. In this power semiconductor module, since the lead terminals are coated with resin, the insulation distance between the cooler and the lead terminals can be ensured.

However, the conventional power semiconductor module has a problem in that since the lead terminals are coated with resin, heat cannot be dissipated sufficiently from the surface of the lead terminals.

SUMMARY

The present disclosure has been made in view of the above circumstances, and it is an object of the present disclosure is to improve heat dissipation properties while also ensuring insulation between a terminal and a cooler.

To solve the above problems, a semiconductor module according to the present disclosure comprises: a first power semiconductor element that includes a first main current electrode; a main body configured to accommodate therein the first power semiconductor element; and a first main current terminal connectable to the first main current electrode, in which the main body includes: a top face; a side face that connects to the top face; a bottom face on an opposite side of the top face, the bottom face being fixable to a cooler; and a recessed portion that is on the side face, and is configured to accommodate therein an end portion of an insulating member, in which the first main current terminal is configured to protrude from the side face of the main body, and includes: a first face; and a second face on an opposite side of the first face, in which the second face is closer to the bottom face than the first face on the side face, and in which the recessed portion is on the side face between the bottom face and the second face, and is at a position apart from the bottom face.

BRIEF DESCRIPTION OF THE DRAWINGS

FIG. 14 is a plan view illustrating a configuration example of a semiconductor apparatus 1E according to a second modification.

DESCRIPTION OF THE EMBODIMENTS

Figure 1:
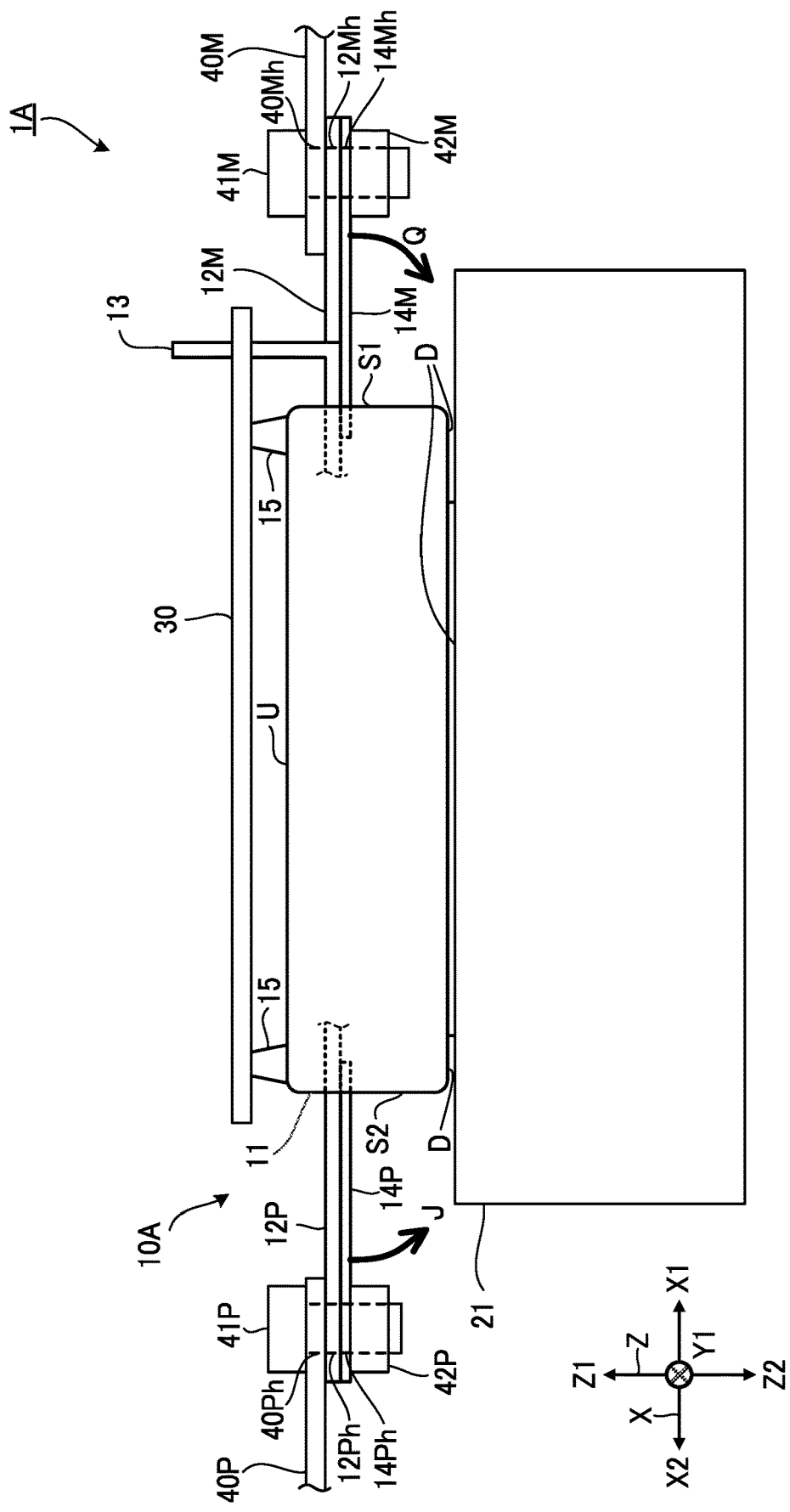
FIG. 1 is a side view illustrating a configuration example of a semiconductor apparatus 1A according to a first embodiment.

Embodiments of the present disclosure will be described below with reference to the drawings. The dimensions and scales of parts in the drawings are different from actual products as appropriate. The embodiments described below are a preferred specific example of the present disclosure.

Therefore, various technically preferable limitations are added to the embodiments. However, the scope of the present disclosure is not limited to the embodiments unless there are descriptions particularly limiting the present disclosure in the following explanations.

1. First Embodiment

Figure 2:
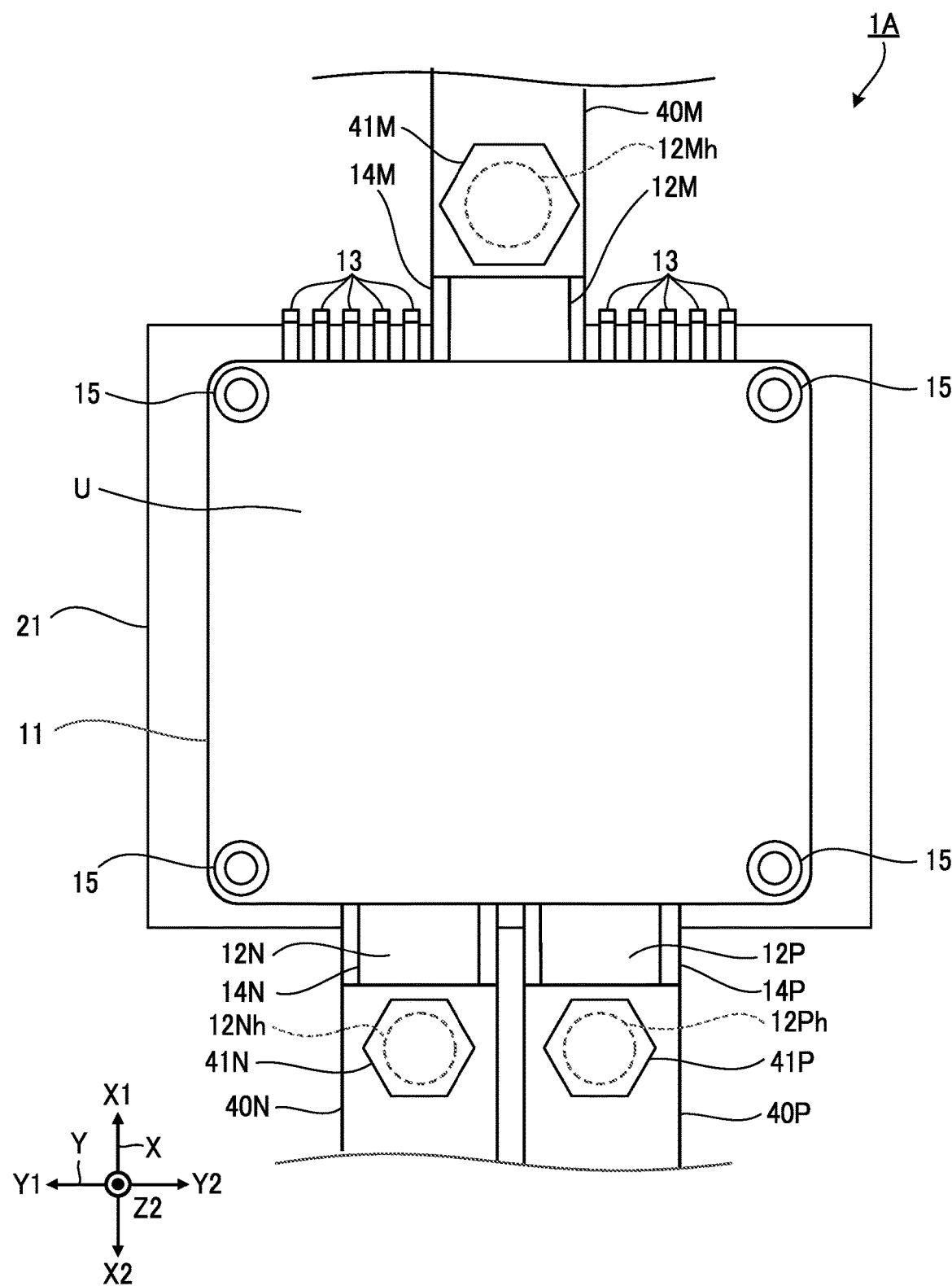
FIG. 2 is a plan view of the semiconductor apparatus 1A with a control board 30 removed therefrom.

FIG. 1 is a side view illustrating a configuration example of a semiconductor apparatus 1A according to a first embodiment of the present disclosure. FIG. 2 is a plan view of the semiconductor apparatus 1A with a control board 30 removed therefrom. The X-axis, the Y-axis, and the Z-axis illustrated in FIG. 1 are perpendicular to each other. The X-axis, the Y-axis, and the Z-axis are the same in each of the diagrams illustrated as examples in the descriptions below. One direction along the X-axis with respect to an arbitrary point is represented as "X1 direction", while the direction opposite to the X1 direction is represented as "X2 direction". Directions opposite to each other from the arbitrary point along the Y-axis are represented as "Y1 direction" and "Y2 direction". Directions opposite to each other from the arbitrary point along the Z-axis are represented as "Z1 direction" and "Z2 direction". The plane including the X-axis and the Y-axis is represented as "X-Y plane". A face on an opposite side of the top face is defined as a bottom face. The top face is positioned more toward the Z1 direction relative to the bottom face. A face on an opposite side of the front face is defined as a back face. The front face is positioned more toward the Z1 direction relative to the back face. In the specification of the present disclosure, the top face, the bottom face, the front face, and the back face are parallel to the X-Y plane unless otherwise specified. A face connecting the top face and the bottom face is represented as a "side face". In the specification of the present disclosure, "plan view" or "viewed in plan" means that a target object is viewed from the Z2 direction, and is synonymous with viewing a target object from a direction vertical to a top face U of a main body 11, described later.

The semiconductor apparatus 1A illustrated in FIG. 1 includes a semiconductor module 10A, a cooler 21, the control board 30, and busbars 40P and 40M. The semiconductor module 10A includes a main body 11, main current terminals 12P and 12M, control terminals 13, insulating members 14P and 14M, and connecting members 15. The semiconductor apparatus 1A further includes a main current terminal 12N and an insulating member 14N, which overlap the main current terminal 12P and the insulating member 14P, respectively, when the main current terminal 12P is viewed from the side in the Y1 direction, although the main current terminal 12N and the insulating member 14N are not illustrated in the side view of FIG. 1 (see FIG. 2).

The main body 11 has an approximately cuboid outer shape, and includes the top face U, a side face S1, a side face S2, and a bottom face D. The side face S1 and the side face S2 connect to the top face U. The side face S2 is on an opposite side of the side face S1. The side face S1 is positioned more toward the X1 direction relative to the side face S2. The bottom face D is on an opposite side of the top face U, and is fixable to the cooler 21. The main body 11 accommodates therein semiconductor chips, described later. The main body 11 can accommodate therein any number of semiconductor chips. In this example, the main body 11 accommodates two semiconductor chips therein. On each of the semiconductor chips, a power semiconductor element capable of high-current switching is formed. The power semiconductor element may include an Insulated Gate Bipolar Transistor (IGBT), a metal-oxide-semiconductor field-effect transistor (MOSFET), a Free Wheeling Diode (FWD), a Reverse Conducting IGBT (RC-IGBT), and the like.

The semiconductor chip includes two main current electrodes, and one control electrode. Each of the main current electrodes receives or supplies a current to be controlled to the power semiconductor element. For example, a collector electrode and an emitter electrode in the RC-IGBT and the IGBT are equivalent to the main current electrodes, and a drain electrode and a source electrode in the MOSFET are also equivalent to the main current electrodes. The control electrode has applied thereto a voltage for controlling the power semiconductor element to ON or OFF. For example, a gate electrode in the RC-IGBT, the IGBT, and the MOSFET is equivalent to the control electrode. Examples of the control electrode may include sense electrodes for a current-sense amplifier and a temperature-sense amplifier in the RC-IGBT, the IGBT, and the MOSFET.

Each of the main current terminals 12P, 12N, and 12M has a flat plate-like shape with the main plane parallel to the X-Y plane on the outside of the main body 11, and extends along the X-axis. Each of the main current terminals 12P, 12N, and 12M is electrically connected to the main current electrodes of the power semiconductor element inside the main body 11. The main plane has one face and another face on an opposite side of the one face. Each of the control terminals 13 has a columnar shape with a smaller width in the Y1 direction than that of the main current terminals 12P, 12N, and 12M. The control terminal 13 includes a horizontal portion extending along the X-axis on the outside of the main body 11, and a vertical portion bent from the horizontal portion and extending along the Z-axis. The control terminal 13 is L-shaped in side view from the Y1 direction. The control terminal 13 is electrically connected to the control electrode of the power semiconductor element inside the main body 11. The main current terminals 12P, 12N, and 12M, and the control terminals 13 are made of a copper conductor or a conductor of other materials. The main current terminal 12M and the control terminals 13 protrude from the side face S1 of the main body 11 toward the X1 direction. The main current terminals 12P and 12N protrude from the side face S2 of the main body 11 toward the X2 direction. That is, the main current terminal 12M and the control terminals 13 protrude from the side face S1 of the main body 11 toward the X1 direction, whereas the main current terminals 12P and 12N protrude from the side face S2 of the main body 11 opposed to the side face S1 toward the X2 direction opposite to the X1 direction. The main current terminals 12P, 12N, and 12M include first openings 12Ph, 12Nh, and 12Mh, respectively, at their tip end portions away from the main body 11. The main current terminals 12P, 12N, and 12M are connected at their tip end portions to busbars 40P, 40N, and 40M, respectively, in a one-to-one correspondence with the first openings 12Ph, 12Nh, and 12Mh. The busbars 40P, 40N, and 40M are electrically connected to an external apparatus (not illustrated), such as a power source or a drive apparatus. Fastening portions will be described later in detail.

The control board 30 is connected to the control terminals 13 at their tip end portions away from the main body 11. For example, the tip end portions of the control terminals 13 penetrate through-holes on the control board 30, and are electrically connected to a circuit pattern formed on the control board 30. The tip end portions of the control terminals 13 may be solder-joined to, or press-fitted into, through-holes on the control board 30. The control terminals 13 are bent at a point away from the side face S1 by a predetermined distance. The predetermined distance is shorter than the length between the side face S1 and the first opening 12Mh of the main current terminal 12M. That is, the first opening 12Mh does not overlap the control terminals 13 in side view from the Y1 direction. In this example, the control board 30 is located at a different position in the Z1 direction from the positions of the busbars 40P, 40N, and 40M, so that the control board 30 does not interfere with the busbars 40P, 40N, and 40M. In addition, the control terminals 13 are located at a different position in the X1 direction from the position of the busbar 40M, so that the control terminals 13 do not interfere with the busbar 40M. Therefore, control wires and main current wires are adequately insulated from each other.

A higher current flows through the main current terminals 12P, 12N, and 12M as compared to the current that flows through the control terminals 13. Since a power semiconductor element generates heat during operation, it is preferable to dissipate the heat from the main current terminals 12P, 12N, and 12M from the viewpoint of protection of the power semiconductor element.

The main body 11 is molded with resin. There are various types of resin molding methods available. As an example of the resin molding methods, a transfer molding process described below can be employed. At a first step of the transfer molding process, semiconductor chips and other components are joined to a lead frame with the main current terminals 12P, 12N, and 12M, and the control terminals 13 formed thereon, and are then wired to the leads. The lead frame in this wired state is placed in a stationary mold. At a second step, the stationary mold and a movable mold are coupled together. At a third step, resin is injected from an injection port of the mold to harden the resin. At a fourth step, the semiconductor module 10A is removed from the molds, unnecessary resin is removed from the semiconductor module 10A, and tie bars and the like of the lead frame are cut. As the resin, a resinous material such as rigid thermosetting resin with relatively high heat resistance can be used. Examples of the resin may include epoxy resin, maleimide resin, and cyanate resin. The resin used for the main body 11 as described above may further have added thereto insulating inorganic filler. Examples of the inorganic filler may include oxides, nitrides, and carbides of silicon, aluminum, or boron.

Although in this example, the semiconductor module 10A is formed by resin molding, the present disclosure is not limited thereto. For example, all the components may be electrically and mechanically connected to a package, and thereafter, the package may be sealed with a sealing resin such as silicone gel or epoxy resin.

Four connecting members 15 are fixed to the top face U of the main body 11 at four corners of the top face U. The control board 30 is fixed at the four connecting members 15. For example, the top face U and the four connecting members 15 are fixed together by using an adhesive, and the four connecting members 15 and the control board 30 are fixed together by using an adhesive. A circuit is located on the control board 30 to generate a control signal to be supplied to the control terminals 13.

The bottom face D of the main body 11 has a heat dissipation surface. The heat dissipation surface may be a region parallel to the back face of the power semiconductor element and be exposed to the bottom face D of the main body 11 in the Z2 direction from the power semiconductor element through an insulating layer such as an insulating plate 121. For example, the heat dissipation surface may be a metal layer 123 of a layered substrate 120, described later (see FIG. 5). The heat dissipation surface may be made up of an insulating layer of a material that is the same as the material of the main body 11. Furthermore, the heat dissipation surface may be a metal base plate of copper or the like. The cooler 21 is fixed to the bottom face D of the main body 11 as described above. In this example, an adhesive sheet with heat dissipation properties is used to fix the cooler 21 and the bottom face D together. However, any fixing method can be used. For example, the cooler 21 and the semiconductor module 10A may be fixed together by using grease. Alternatively, the cooler 21 and the semiconductor module 10A may be joined together by screwing, or by using solder or a brazing material. In this example, the heat dissipation surface protrudes toward the Z2 direction from a portion of the bottom face D excluding the heat dissipation surface. Therefore, the bottom face D is not parallel to the X-Y plane. However, the position of the heat dissipation surface in the Z2 direction may correspond with the position of a portion of the bottom face D excluding the heat dissipation surface in the Z2 direction. In this case, the bottom face D is parallel to the X-Y plane.

Figure 3:
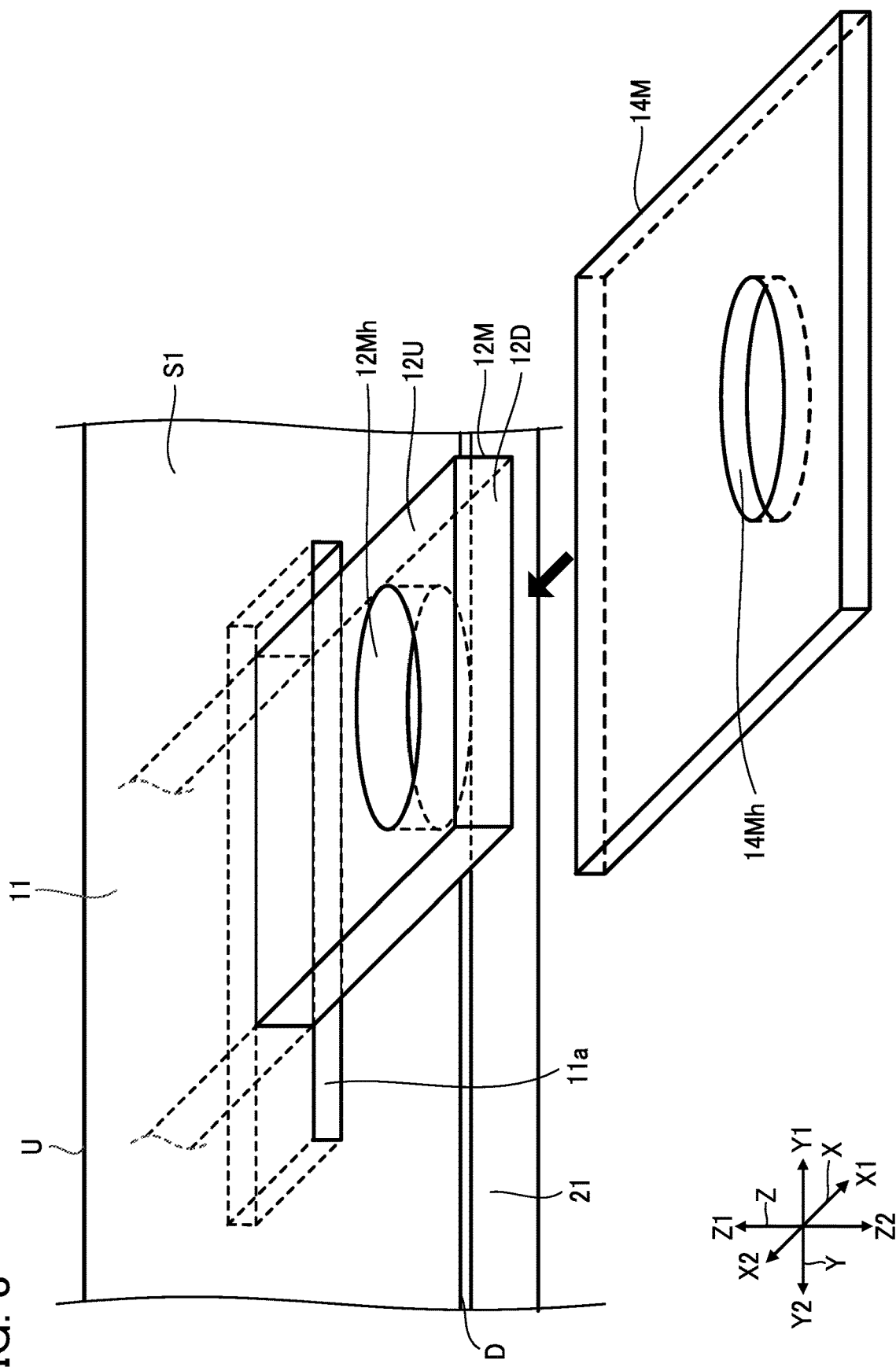
FIG. 3 is a perspective view schematically illustrating the locations of a main current terminal 12M and an insulating member 14M.

FIG. 3 is a perspective view schematically illustrating the locations of the main current terminal 12M and the insulating member 14M. The main current terminal 12M and the control terminals 13 protrude from the side face S1 of the main body 11 toward the X1 direction. The main current terminals 12P and 12N protrude from the side face S2 of the main body 11 toward the X2 direction. The main current terminal 12M includes a first face 12U and a second face 12D on an opposite side of the first face 12U. The second face 12D is closer to the cooler 21 than the first face 12U.

The semiconductor module 10A is cooled by the cooler 21. For example, the cooler 21 is a heatsink; however, the cooler 21 may be a water-cooling apparatus that circulates refrigerant such as water. The cooler 21 is made of a material with relatively low heat resistance. Examples of the material with relatively low heat resistance include metal such as aluminum and copper. In addition, the main current terminal 12M is applied with a voltage of, for example, 1200 V. It is thus necessary to sufficiently insulate the cooler 21 from the main current terminal 12M.

The insulating member 14M is used to adequately insulate the cooler 21 from the main current terminal 12M. The insulating member 14M is made of an insulating material. The insulating member 14M is provided separately from the main body 11. The insulating member 14M is relatively thin, wide, and long. The insulating member 14M may have a thickness equal to, or greater than, 100 μm and equal to, or less than, 4 mm. The insulating member 14M may be easily bent. For example, the insulating member 14M may be insulating paper, an insulating sheet, or an insulating plate. For example, insulating paper of entangled natural fiber, chemical fiber, or glass fiber is formed into a thin flat shape. This insulating paper is easily bendable. The insulating sheet may be made of, for example, polyimide, silicone resin, fluororesin, or synthetic rubber. The insulating plate may be made of, for example, ceramics, epoxy resin, or polycarbonate resin. The insulating plate may also be formed by laminating the insulating paper and the insulating sheet together. The insulating materials in this example are different from the resin used for molding the main body 11.

On the side face S1 of the main body 11, a recessed portion 11a is formed. The recessed portion 11a is present on the side face S1 between the bottom face D and the second face 12D of the main current terminal 12M at a position apart from the bottom face D, instead of being present on the side face S1 between the top face U and the first face 12U of the main current terminal 12M. In this example, the recessed portion 11a is approximately cuboid shaped. An end portion of the insulating member 14M is accommodated in the recessed portion 11a. A portion of the second face 12D of the main current terminal 12M serves as a face that defines the recessed portion 11a. In this example, since the insulating member 14M has a cuboid shape, the recessed portion 11a is approximately cuboid shaped accordingly. However, the present disclosure is not limited thereto. The recessed portion 11a may have any shape as long as the recessed portion 11a can accommodate therein the end portion of the insulating member 14M.

The insulating member 14M illustrated in FIG. 3 is fitted into the recessed portion 11a so that a portion of the insulating member 14M is accommodated in the recessed portion 11a. Thus, the insulating member 14M extends into the main body 11 since one end portion of the insulating member 14M is accommodated in the recessed portion 11a of the main body 11. The insulating member 14M protrudes outward from the side face S1 of the main body 11. In this example, the recessed portion 11a is formed in contact with the second face 12D of the main current terminal 12M. Due to this structure, on the side face S1, the top face of the insulating member 14M is in contact with the second face 12D of the main current terminal 12M.

The first opening 12Mh is formed on a portion of the main current terminal 12M protruding from the side face S1. The insulating member 14M is formed with a second opening 14Mh. As illustrated in FIG. 1, a bolt 41M is inserted through a through-hole 40Mh on the busbar 40M, the first opening 12Mh on the main current terminal 12M, and the second opening 14Mh on the insulating member 14M. The bolt 41M is fastened by a nut 42M. Due to this fastening, the busbar 40M, the main current terminal 12M, and the insulating member 14M are fastened together. The first opening 12Mh on the main current terminal 12M serves as a fixing portion to fix the insulating member 14M. The main current terminals 12P and 12N have a configuration substantially the same as that of the main current terminal 12M. The insulating members 14P and 14N have a configuration substantially the same as that of the insulating member 14M. The busbars 40P and 40N have a configuration substantially the same as that of the busbar 40M. That is, a bolt 41P is inserted through a through-hole 40Ph on the busbar 40P, a first opening 12Ph on the main current terminal 12P, and a second opening 14Ph on the insulating member 14P, so that the busbar 40P, the main current terminal 12P, and the insulating member 14P are fastened together by the bolt 41P. The busbar 40N, the main current terminal 12N, and the insulating member 14N are fastened together by using a bolt 41N.

In this embodiment, the second opening 14Mh in plan view is circular-shaped, but it is not limited thereto. The shape of the second opening 14Mh is freely selected as long as the busbar 40M, the main current terminal 12M, and the insulating member 14M can be fastened together. Furthermore, in plan view, the second opening 14Mh is formed inside the insulating member 14M, but it is not limited thereto. Instead of the circular second opening 14Mh, a sector-shape opening may be formed at the end of the insulating member 14M.

In this embodiment, the bolt 41P and the busbars 40P are separated from each other, but they may be unitary. The number of components is reduced. The same applies to the bolt 41N and the busbar 40N, and applies to the bolt 41M and the busbar 40M.

The busbars 40P, 40M, and 40N are fixed, for example, to the package of the semiconductor apparatus 1A. As described above, the busbars 40P, 40M, and 40N are fixed to the main current terminals 12P, 12M, and 12N, respectively, in a one-to-one correspondence. Assuming that the positions of the busbars 40P and 40M illustrated in FIG. 1 are shifted toward the Z2 direction, the main current terminal 12P is displaced toward the direction of an arrow J, whereas the main current terminal 12M is displaced toward the direction of an arrow Q. In other words, according to the relative position between the semiconductor module 10A and the busbars 40P, 40M, and 40N, the insulation distance between the cooler 21 and the main current terminals 12P, 12M, and 12N may be reduced in some cases. In contrast, although the control terminals 13 are fixed to the control board 30, the relative position between the control board 30 and the control terminals 13 can be easily adjusted when the control board 30 is attached to the connecting members 15. Therefore, the control terminals 13 are only slightly displaced toward the Z2 direction by attachment of the control board 30. In view of this, the semiconductor module 10A is provided with the insulating members 14P, 14M, and 14N in a one-to-one correspondence with the main current terminals 12P, 12M, and 12N, whereas no insulating member is provided between the cooler 21 and the control terminals 13. Due to this configuration, portions of the control terminals 13, which protrude from the side face S1 of the main body 11, do not overlap the insulating members 14P, 14M, and 14N at all in plan view.

A portion of the insulating member 14M is positioned between the cooler 21 and the second face 12D of the main current terminal 12M. Thus, the insulation properties between the cooler 21 and the main current terminal 12M are improved compared to the case in which the insulating member 14M is not provided. In contrast, the first face 12U of the main current terminal 12M is not covered by the insulating member 14M, but is exposed to the space. Therefore, the main current terminal 12M can dissipate heat generated in the power semiconductor element from a portion of the main current terminal 12M protruding from the side face S1.

Figure 4:
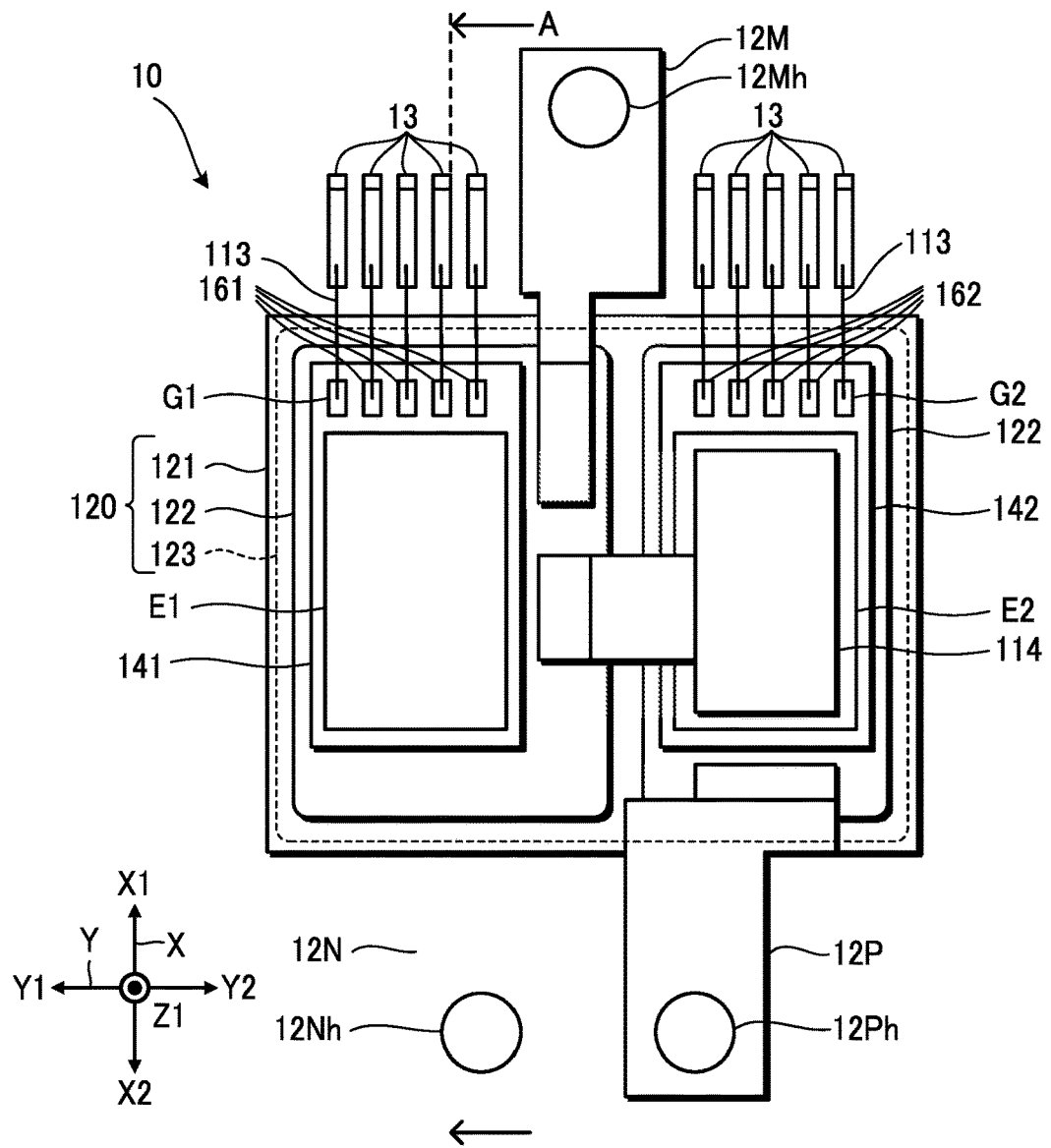
FIG. 4 is a plan view of a semiconductor module 10A as viewed in plan in a Z2 direction.
Figure 5:
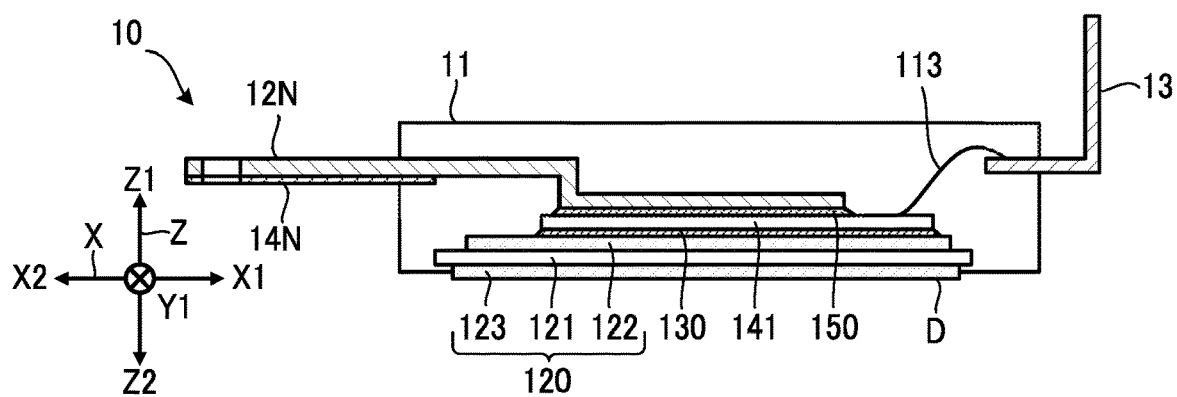
FIG. 5 is a cross-sectional view of the semiconductor module 10A taken along line A-A' illustrated in FIG. 4.

Next, the internal structure of the semiconductor module 10A is described. FIG. 4 is a plan view of the semiconductor module 10A as viewed in plan in the Z2 direction. However, FIG. 4 omits illustrations of resin to be used for molding. FIG. 5 is a cross-sectional view of the semiconductor module 10A taken along line A-A' illustrated in FIG. 4.

As illustrated in FIGS. 4 and 5, the semiconductor module 10A includes the layered substrate 120, joining members 130 and 150, and semiconductor chips 141 and 142.

The layered substrate 120 includes the insulating plate 121, a wiring layer 122, and the metal layer 123. The insulating plate 121 includes an upper face and a lower face on an opposite side of the upper face. The lower face is positioned more toward the Z2 direction relative to the upper face. The insulating plate 121 may be made of a ceramic material such as alumina ($Al_2O_3$), aluminum nitride (AlN), or silicon nitride ($Si_3N_4$).

The wiring layer 122 is provided on the upper face of the insulating plate 121. A wiring pattern made of a copper conductor, a copper alloy conductor, or a conductor of other materials is formed on the wiring layer 122. The metal layer 123 is provided on the back face of the insulating plate 121. The metal layer 123 has a function of transferring heat generated in the semiconductor chips 141 and 142 to the cooler 21. For example, the metal layer 123 can be made of metal with relatively low heat resistance, such as copper or aluminum. For example, the layered substrate 120 may be a DCB (Direct Copper Bonding) substrate or an AMB (Active Metal Brazing) substrate.

The metal layer 123 of the layered substrate 120 is fixed to the cooler 21 by a heat dissipation sheet. The wiring layer 122 of the layered substrate 120 is electrically and mechanically connected to the semiconductor chips 141 and 142 through the joining member 130. For example, solder is used as the joining member 130.

At least a low-side RC-IGBT (hereinafter, "first RC-IGBT") is formed on the semiconductor chip 141. The first RC-IGBT is an example of a first power semiconductor element. At least a high-side RC-IGBT (hereinafter, "second RC-IGBT") is formed on the semiconductor chip 142. The second RC-IGBT is an example of a second power semiconductor element.

Each of the semiconductor chips 141 and 142 includes a front face and a back face on an opposite side of the front face. The back face is positioned more toward the Z2 direction relative to the front face. A collector electrode is formed on the back face of the semiconductor chip 141. A collector electrode is formed on the back face of the semiconductor chip 142. An emitter electrode E1, a connection electrode G1 electrically connected to a gate electrode, and four connection electrodes 161 are located on the front face of the semiconductor chip 141. Similarly to the semiconductor chip 141, an emitter electrode E2, a connection electrode G2 electrically connected to a gate electrode, and four connection electrodes 162 are located on the front face of the semiconductor chip 142. The four connection electrodes 161 are electrically connected to a temperature sensor and a current sensor formed on the semiconductor chip 141. The four connection electrodes 162 are electrically connected to a temperature sensor and a current sensor formed on the semiconductor chip 142. The connection electrodes G1, G2, 161, and 162 are electrically and mechanically connected to their respective control terminals 13 through wires 113.

The main current terminal 12P is electrically connected to the collector electrode of the second RC-IGBT through the wiring layer 122. The second RC-IGBT is controlled to be ON or OFF on the basis of a control signal supplied to the connection electrode G2. The emitter electrode E2 of the second RC-IGBT is electrically and mechanically connected to a wire 114 through the joining member 150. The wire 114 is made of copper or copper alloys. The wire 114 is electrically connected to the main current terminal 12M and the collector electrode of the first RC-IGBT through the wiring layer 122 illustrated on the left side in FIG. 4. The first RC-IGBT is controlled to be ON or OFF on the basis of a control signal supplied to the connection electrode G1. The emitter electrode E1 of the first RC-IGBT is electrically and mechanically connected to the main current terminal 12N through the joining member 150.

Figure 6A:
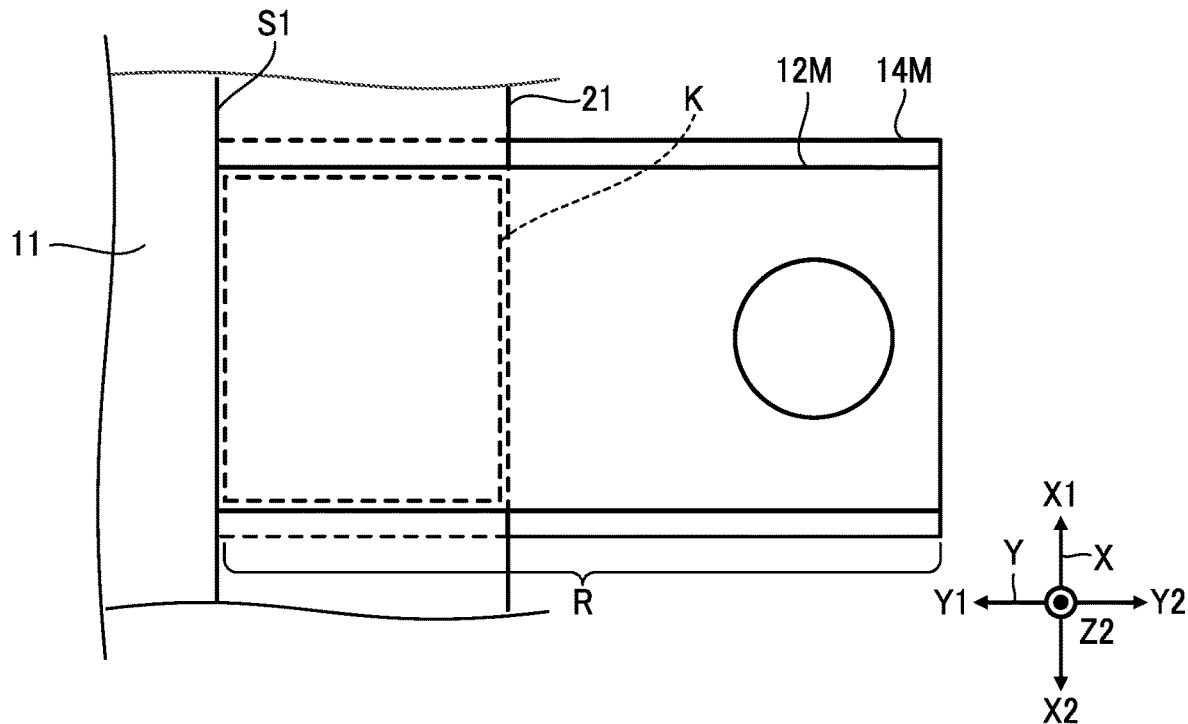
FIG. 6A is a plan view schematically illustrating an example of the locations of the main current terminal 12M, the insulating member 14M, and a cooler 21 when the main current terminal 12M is viewed in plan in the Z2 direction.

Next, the insulation properties between the main current terminal 12M and the cooler 21 will be described. FIG. 6A is a plan view schematically illustrating the locations of the main current terminal 12M, the insulating member 14M, and the cooler 21 when the main current terminal 12M is viewed in plan. As illustrated in FIG. 6A, a portion R of the main current terminal 12M, protruding from the side face S1 of the main body 11, overlaps a portion of the insulating member 14M. Insulation between the cooler 21 and the main current terminal 12M needs to be taken into account for a zone K in which the portion R protruding from the side face S1 of the main body 11 overlaps the cooler 21. In this example, since the zone K entirely overlaps the insulating member 14M, the cooler 21 is adequately insulated from the main current terminal 12M.

Figure 6B:
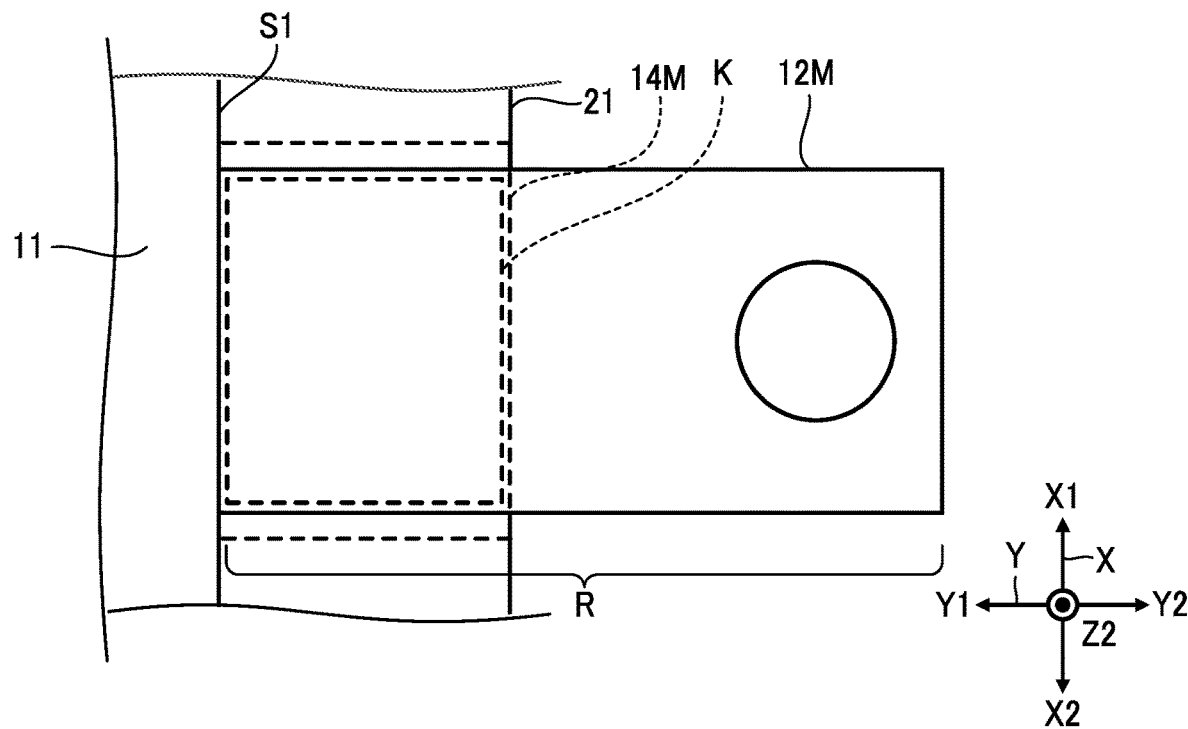
FIG. 6B is a plan view schematically illustrating another example of the locations of the main current terminal 12M, the insulating member 14M, and the cooler 21.

Provided that the zone K entirely overlaps the insulating member 14M, the insulating member 14M may be smaller in size than that in the aspect illustrated in FIG. 6A. For example, as illustrated in FIG. 6B, the insulating member 14M may be located in such a manner that the position of the end face of the cooler 21 in the Y2 direction aligns with the position of the end face of the insulating member 14M in the Y2 direction. In this case, a portion of the insulating member 14M protrudes from the side face S1, and this protruding portion entirely overlaps the cooler 21 in plan view. A portion of the insulating member 14M, which extends into the main body 11, overlaps the cooler 21 in plan view. Thus, in the aspect illustrated in FIG. 6B, the insulating member 14M entirely overlaps the cooler 21 in plan view. As a result, the portion R of the main current terminal 12M, protruding from the side face S1 of the main body 11, overlaps a portion of the insulating member 14M in plan view. In the aspect illustrated in FIG. 6B, the cooler 21 is adequately insulated from the main current terminal 12M, whereas the area of the insulating member 14M is decreased as compared to the case in which the insulating member 14M extends beyond the zone of the cooler 21 in the Y2 direction in plan view.

Figure 6C:
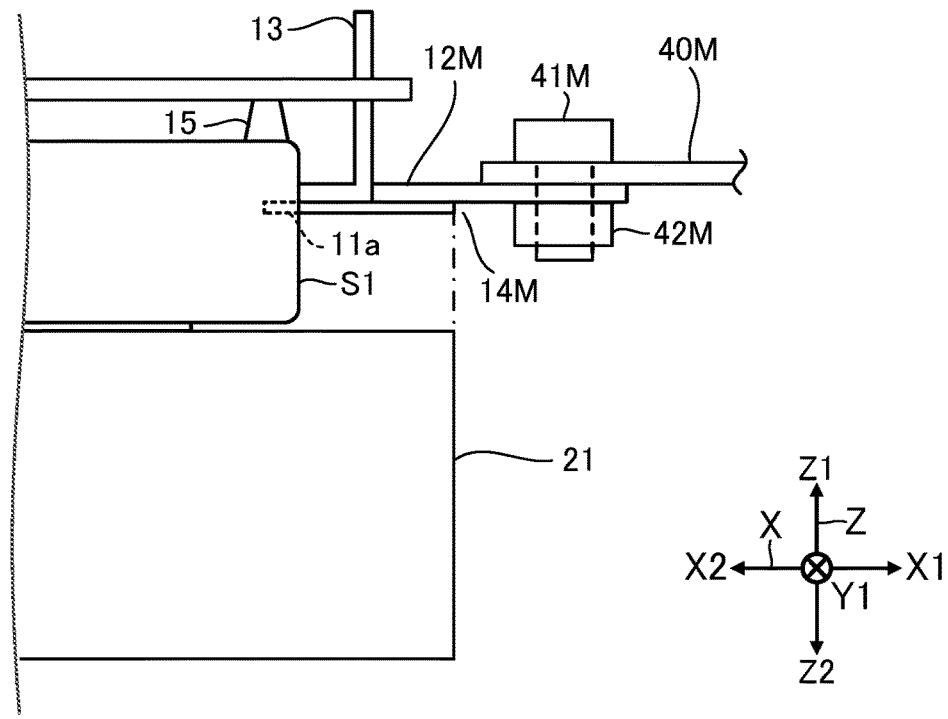
FIG. 6C is a side view of the semiconductor apparatus 1A viewed from the side in a Y1 direction when the insulating member 14M illustrated in FIG. 6B is employed.

FIG. 6C is a side view of the semiconductor apparatus 1A viewed from the side in the Y1 direction when the insulating member 14M illustrated in FIG. 6B is employed. In this case, the end portion of the insulating member 14M is supported by being accommodated in the recessed portion 11a. However, this support is not sufficient for the insulating member 14M to be fixed to the main current terminal 12M. In view of this, the insulating member 14M may be fixed to the second face 12D of the main current terminal 12M by using an adhesive. In an aspect in which the insulating member 14M is fixed to the second face 12D of the main current terminal 12M by using an adhesive, it is not essential for the insulating member 14M to be partially accommodated in the recessed portion 11a. In other words, the insulating member 14M does not need to extend into the main body 11, but may extend outward from the main body 11. In this case, it is preferable for the insulating member 14M to come into contact with the side face S1 from the viewpoint of ensuring adequate insulation properties. However, the insulating member 14M may be spaced apart from the side face S1. In a case in which the insulating member 14M is spaced apart from the side face S1, a portion of the insulating member 14M, which is closest to the side face S1, is an end face of the insulating member 14M positioned more toward the X2 direction relative to the second opening 14Mh. The end face of the insulating member 14M is present between the bottom face D and the second face 12D at a position away from the bottom face D in side view from the direction perpendicular to the side face S1.

The insulating member 14M is provided for the purpose of insulating the cooler 21 from the main current terminal 12M. In view of this purpose, the insulating member 14M does not always need to come into contact with the main current terminal 12M. There may be a gap between the insulating member 14M and the main current terminal 12M. That is, it is sufficient for a portion of the insulating member 14M to be positioned between the second face 12D and the cooler 21. In the example of the present disclosure, the insulating member 14M is not in contact with the cooler 21. The insulating member 14M is located without being fitted into the space between the bottom face D of the main body 11 and the top face of the cooler 21. This prevents both degradation in the heat dissipation properties from the top face of the cooler 21, and degradation in the heat transfer properties from the main body 11 to the cooler 21, and this can thus improve heat dissipation properties of the main body 11. Preferably, the gap is positioned closer to the second face 12D relative to the cooler 21 on the side faces S1 and S2 of the main body 11. That is, a portion of the insulating member 14M is preferably positioned closer to the second face 12D relative to the cooler 21 on the side faces S1 and S2 of the main body 11. With this positioning, whereas the area of the insulating member 14M is decreased, the cooler 21 can be more reliably insulated from the main current terminal 12M.

Figure 6D:
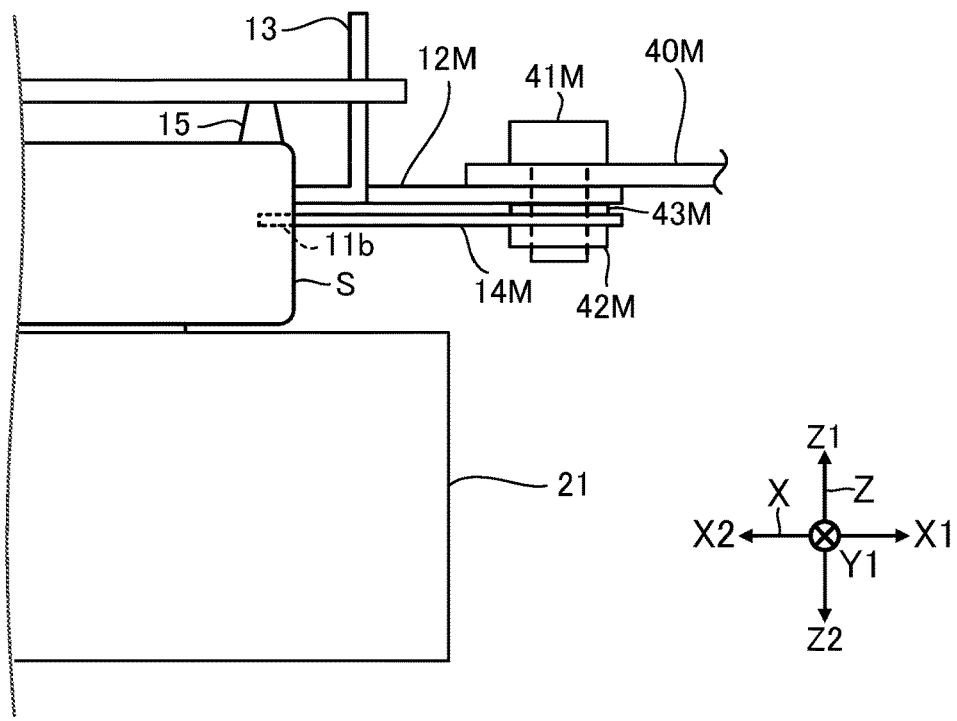
FIG. 6D is a side view illustrating an example of the locations of the main current terminal 12M, the insulating member 14M, and the cooler 21.

FIG. 6D is a side view illustrating an example of the locations of the main current terminal 12M, the insulating member 14M, and the cooler 21. In FIG. 6D, the semiconductor apparatus 1A is viewed from the side in the Y1 direction. In the example of the locations illustrated in FIG. 6D, a recessed portion 11b is provided at a position shifted toward the Z2 direction, as compared to the recessed portion 11a illustrated in FIG. 3. In this case, one end of the insulating member 14M is accommodated in the recessed portion 11b. The busbar 40M, the main current terminal 12M, a washer 43M, and the insulating member 14M are jointly fastened by using the bolt 41M and the nut 42M. In this aspect, heat can be dissipated from the second face 12D of the main current terminal 12M. The locations of the main current terminal 12M, the insulating member 14M, and the cooler 21 have been described above. The main current terminals 12P and 12N, the insulating members 14P and 14N, and the cooler 21 are also located in a manner substantially the same as described above.

As described above, the semiconductor module 10A according to the first embodiment includes the semiconductor chip 141, the main body 11, and the main current terminal 12M. The main body 11 includes the side face S1 and the bottom face D fixed to the cooler 21, and accommodates the semiconductor chip 141 therein. The main body 11 includes the top face U, the side faces S1 and S2 connecting to the top face U, and the bottom face D on an opposite side of the top face U and fixable to the cooler 21. A power semiconductor element including the main current electrodes is formed on the semiconductor chip 141. The main current terminal 12M includes the first face 12U and the second face 12D, is connected to the main current electrodes, and protrudes from the side face S1. The main body 11 includes the recessed portion 11a on the side face S1. The end portion of the insulating member 14M is accommodated in the recessed portion 11a. The recessed portion 11a is present on the side face S1 between the bottom face D and the second face 12D at a position away from the bottom face D. A portion of the insulating member 14M closest to the side face S1 is at an edge portion of the recessed portion 11a opened on the side face S1. The portion of the insulating member 14M closest to the side face S1 is positioned between the bottom face D and the second face 12D and away from the bottom face D in side view from the X2 direction perpendicular to the side face S1. The first face 12U is on an opposite side of the second face 12D and is not covered by the insulating member 14M. The second face 12D is closer to the cooler 21 than the first face 12U. At least a portion of the insulating member 14M is positioned between the second face 12D and the cooler 21.

In the semiconductor module 10A, at least a portion of the insulating member 14M is positioned between the second face 12D and the cooler 21. Thus, the insulation properties between the main current terminal 12M and the cooler 21 improve as compared to the case in which the insulating member 14M is not provided. Since the first face 12U of the main current terminal 12M is not covered by the insulating member 14M, the amount of heat to be dissipated from the first face 12U can be increased as compared to the case in which the first face 12U is covered by the insulating member 14M. As a result, the semiconductor module 10A can efficiently dissipate heat generated in the power semiconductor element from the first face 12U, while at the same time improve insulation properties between the main current terminal 12M and the cooler 21.

Stress is concentrated on the boundary between the main current terminal 12M and the main body 11. Thus, if the insulating member 14M is fixed to the second face 12D of the main current terminal 12M with an adhesive, the insulating member 14M is more likely to separate from the boundary between the main current terminal 12M and the main body 11. In contrast, in the semiconductor module 10A, the end portion of the insulating member 14M is accommodated in the recessed portion 11a. This prevents the insulating member 14M from separating from the boundary between the main current terminal 12M and the main body 11 on which stress is concentrated, as compared to the case in which the insulating member 14M is fixed to the main current terminal 12M with an adhesive.

In the semiconductor module 10A, a portion of the main current terminal 12M protruding from the side face S1 overlaps a part or the whole of the insulating member 14M in plan view. In addition, portions of the control terminals 13 protruding from the side face S1 do not overlap the insulating member 14M at all in plan view. That is, on the outside of the main body 11, the insulating member 14M is interposed between the main current terminal 12M and the cooler 21; however, the insulating member 14M is not interposed between the control terminals 13 and the cooler 21. Forming the insulating member 14M on each of the control terminals 13 results in degradation in workability. In contrast, if a single insulating member 14M is formed in common between the control terminals 13 and the main current terminal 12M, or a single insulating member 14M is formed in common between a plurality of control terminals 13, then dust particles may be deposited on the insulating member 14M, and there may be a possibility that the insulation properties between the main current terminal 12M and the control terminals 13, or the insulation properties between the plurality of control terminals 13 may be degraded. It is preferable that heat generated in the semiconductor chip 141 present inside the main body 11 be dissipated from the control terminals 13 from the viewpoint of protection of the semiconductor chip 141. The semiconductor module 10A has an advantage that heat can be dissipated from the surface of the control terminals 13 over the case where the control terminals 13 are coated with an insulating material.

A portion of the main current terminal 12M protruding from the side face S1 is provided with the first opening 12Mh that serves as a fixing portion to fix the insulating member 14M. According to this aspect, the main current terminal 12M that is a target to be insulated is provided with the fixing portion, so that the configuration can be more simplified as compared to the case in which another member is provided with the fixing portion. In a case in which the recessed portion 11a is provided on the side face S1 of the main body 11 to accommodate one end portion of the insulating member 14M in the recessed portion 11a, the one end portion of the insulating member 14M is supported by the main body 11. Additionally, the insulating member 14M is fixed to the main current terminal 12M by the fixing portion, so that the insulating member 14M is fixed at two points.

In the semiconductor module 10A, the first opening 12Mh provided on the main current terminal 12M is an example of the fixing portion. The insulating member 14M is provided with the second opening 14Mh. The main current terminal 12M and the insulating member 14M are then fixed together by the bolt 41M (an example of a screw) inserted through the first opening 12Mh and the second opening 14Mh. According to this aspect, the main current terminal 12M and the insulating member 14M can be screwed one to the other, so that the main current terminal 12M and the insulating member 14M are fixed together with a simple configuration.

The main current terminal 12M is positioned between the insulating member 14M and the busbar 40M having the through-hole 40Mh. The bolt 41M (an example of the screw) is inserted through the through-hole 40Mh, the first opening 12Mh, and the second opening 14Mh, so that the first face 12U of the main current terminal 12M and the busbar 40M are electrically connected. According to this aspect, the busbar 40M, the main current terminal 12M, and the insulating member 14M are fastened together. Consequently, a configuration to fix the busbar 40M and the main current terminal 12M together can also serve as a configuration to fix the insulating member 14M and the main current terminal 12M together.

The first opening 12Mh as an example of the fixing portion is located at such a position that the first opening 12Mh does not overlap the cooler 21 in plan view. Consequently, the insulation properties between the main current terminal 12M and the cooler 21 are improved compared to the case in which the first opening 12Mh is located at such a position that the first opening 12Mh overlaps the cooler 21 in plan view. In particular, when the bolt 41M is used, the end portion of the bolt 41M protrudes from the insulating member 14M, and it is thus necessary to ensure a sufficient insulation distance between the bolt 41M and the cooler 21. In this aspect, the first opening 12Mh does not overlap the cooler 21 in plan view. Thus, the sufficient insulation distance is ensured without the need to sufficiently space the cooler 21 apart from the main current terminal 12M. As a result, the semiconductor module 10A is reduced in size.

The insulating member 14M is made of insulating paper, an insulating sheet, or an insulating plate. This facilitates handling of the insulating member 14M as compared to the case in which the insulating member 14M is coated on the main current terminal 12M, and also simplifies molding of the main body 11 compared to the case in which the insulating member 14M is molded integrally with the main body 11. Therefore, cost can be reduced.

2. Second Embodiment

In the semiconductor apparatus 1A according to the first embodiment, the main current terminals 12P and 12N have a flat plate-like shape and extend along the horizontal plane. In contrast, a semiconductor apparatus 1B according to a second embodiment is different from the semiconductor apparatus 1A in that the main current terminals 12P and 12N have an L-shape and a cooler 22 is used instead of the cooler 21. The semiconductor apparatus 1B according to the second embodiment is described below, mainly focusing on points of difference.

Figure 7:
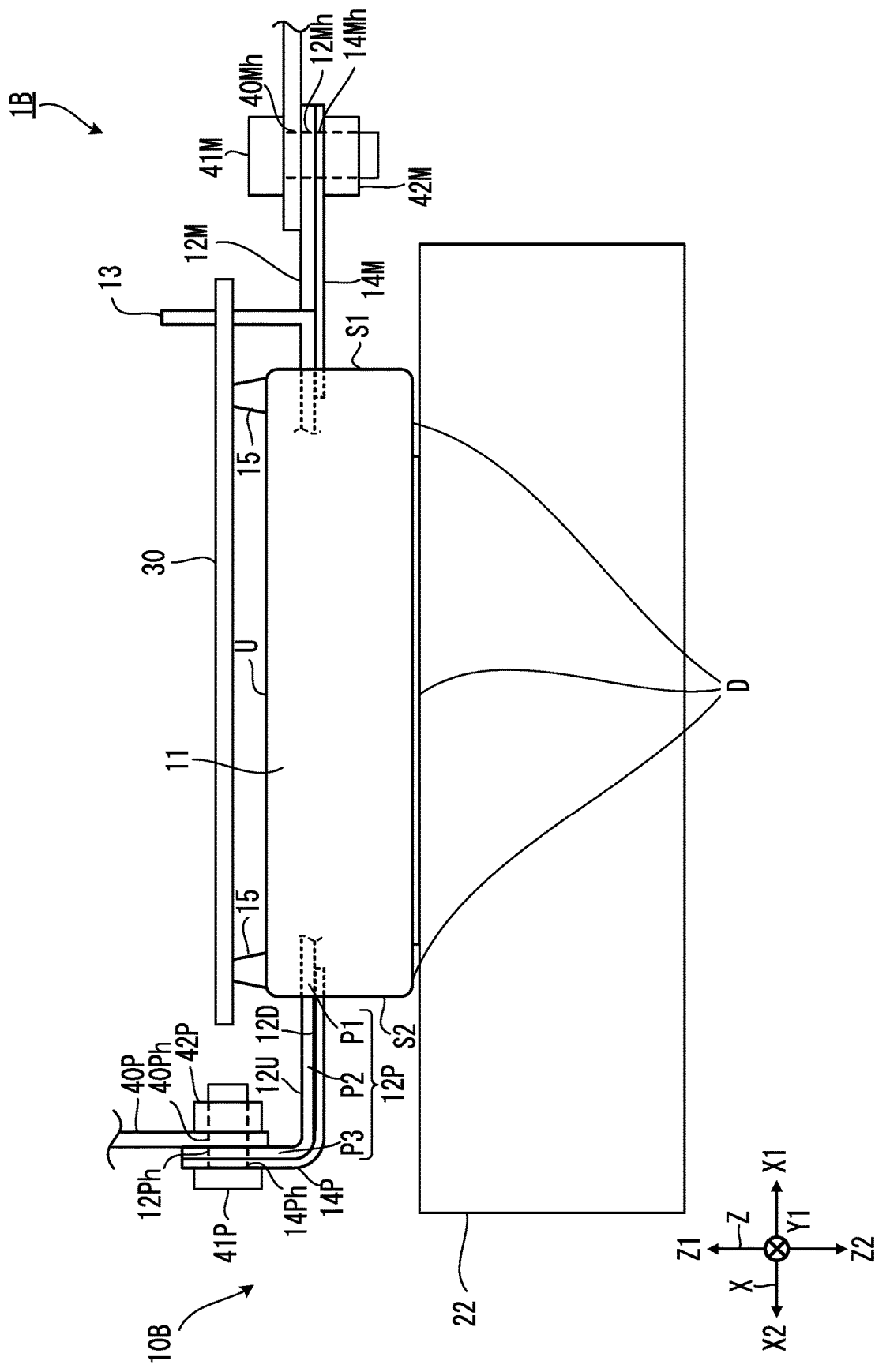
FIG. 7 is a side view illustrating a configuration example of a semiconductor apparatus 1B according to a second embodiment of the present disclosure.
Figure 8:
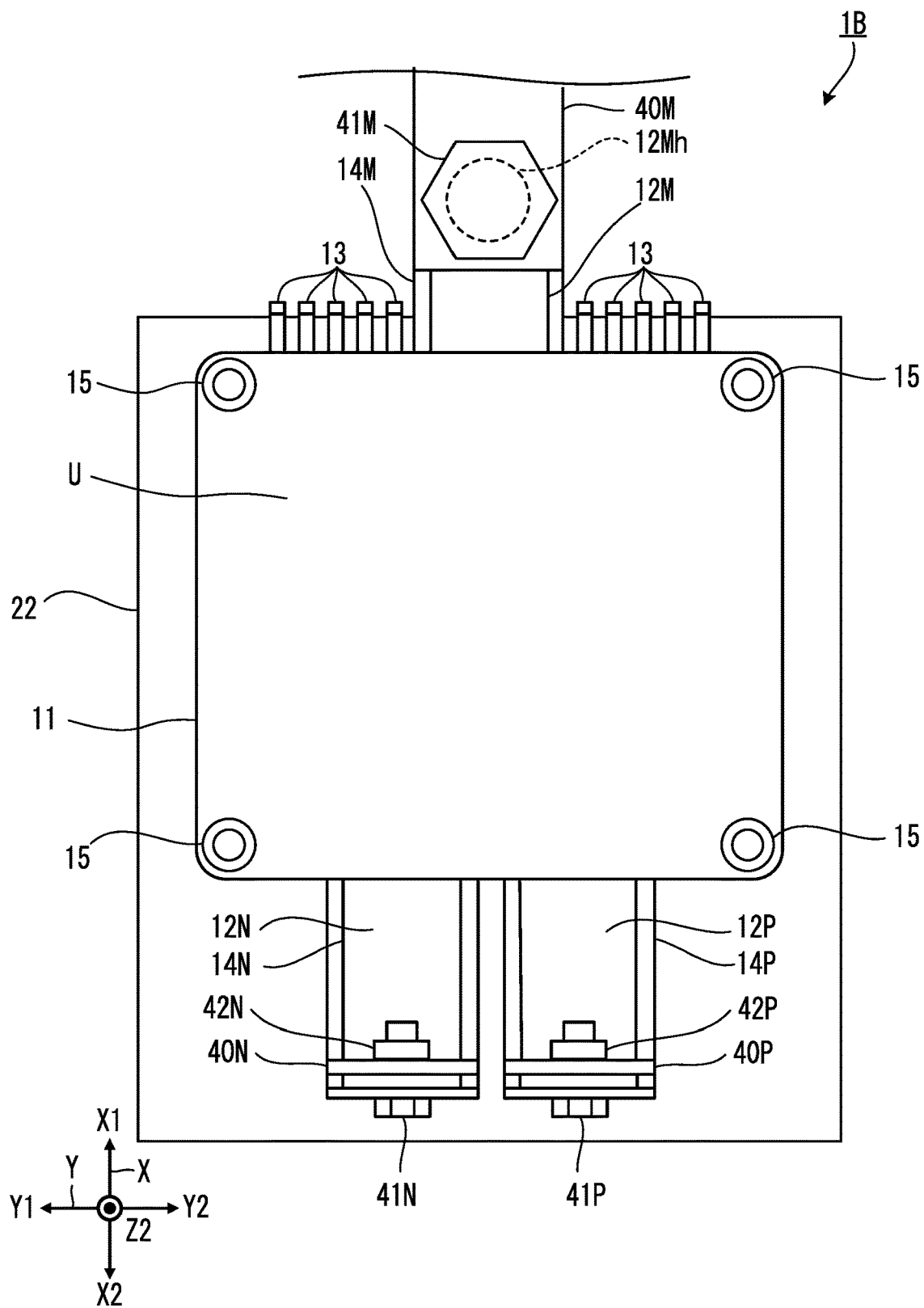
FIG. 8 is a plan view of the semiconductor apparatus 1B with the control board 30 removed therefrom.

FIG. 7 is a side view illustrating a configuration example of the semiconductor apparatus 1B according to the second embodiment of the present disclosure. FIG. 8 is a plan view of the semiconductor apparatus 1B with the control board 30 removed therefrom. The semiconductor apparatus 1B has a configuration substantially the same as that of the semiconductor apparatus 1A illustrated in FIGS. 1 and 2, except for the shape of the main current terminals 12P and 12N, and the locations of the busbars 40P and 40N.

As illustrated in FIGS. 7 and 8, the main current terminal 12P includes a first portion P1, a second portion P2, and a third portion P3. The first portion P1 extends into the main body 11. The second portion P2 is connected with the first portion P1 and protrudes outward from the main body 11. The third portion P3 forms an angle relative to the second portion P2 in a direction away from the cooler 22. In this example, the third portion P3 forms an angle of approximately 90 degrees relative to the second portion P2. The third portion P3 is formed with the first opening 12Ph. The first opening 12Ph is an example of the fixing portion to fix the insulating member 14P to the main current terminal 12P.

The insulating member 14P has an L-shape, similarly to the main current terminal 12P, and is provided along the second face 12D of the main current terminal 12P. The bolt 41P is inserted through the second opening 14Ph on the insulating member 14P, the first opening 12Ph on the main current terminal 12P, and the through-hole 40Ph on the busbar 40P in the X1 direction, and is fastened by using a nut 42P to be screwed in the X2 direction.

The bolt 41P and the busbars 40P are separated from each other, but they may be unitary in a manner similar to the first embodiment. The same applies to the bolt 41N and the busbar 40N, and applies to the bolt 41M and the busbar 40M.

As illustrated in FIG. 8, when the cooler 22 is viewed in plan, a portion of the main current terminal 12P, positioned outside the main body 11, overlaps the cooler 22. In the above plan view, the portion of the main current terminal 12P described above overlaps the insulating member 14P. Furthermore, in the above plan view, the first opening 12Ph overlaps the cooler 22. Since the main current terminal 12P according to the first embodiment is provided along the X-Y plane, the distance from the bolt 41P to the plane including the bottom face D is short. Due to this short distance, the main current terminal 12P is located in such a manner as to prevent the first opening 12Ph from overlapping the cooler 21 in plan view (see FIG. 1). In contrast, in the semiconductor apparatus 1B, the third portion P3 of the main current terminal 12P forms an angle relative to the second portion P2 in a direction away from the cooler 22. Therefore, even when the first opening 12Ph corresponding to the bolt 41P overlaps the cooler 22 in the above plan view, sufficient insulation distance between the bolt 41P and the cooler 22 can still be ensured. As a result, the semiconductor apparatus 1B can use the cooler 22 of a larger size than the cooler 21, and thus, can efficiently cool the main body 11.

Figure 9A:
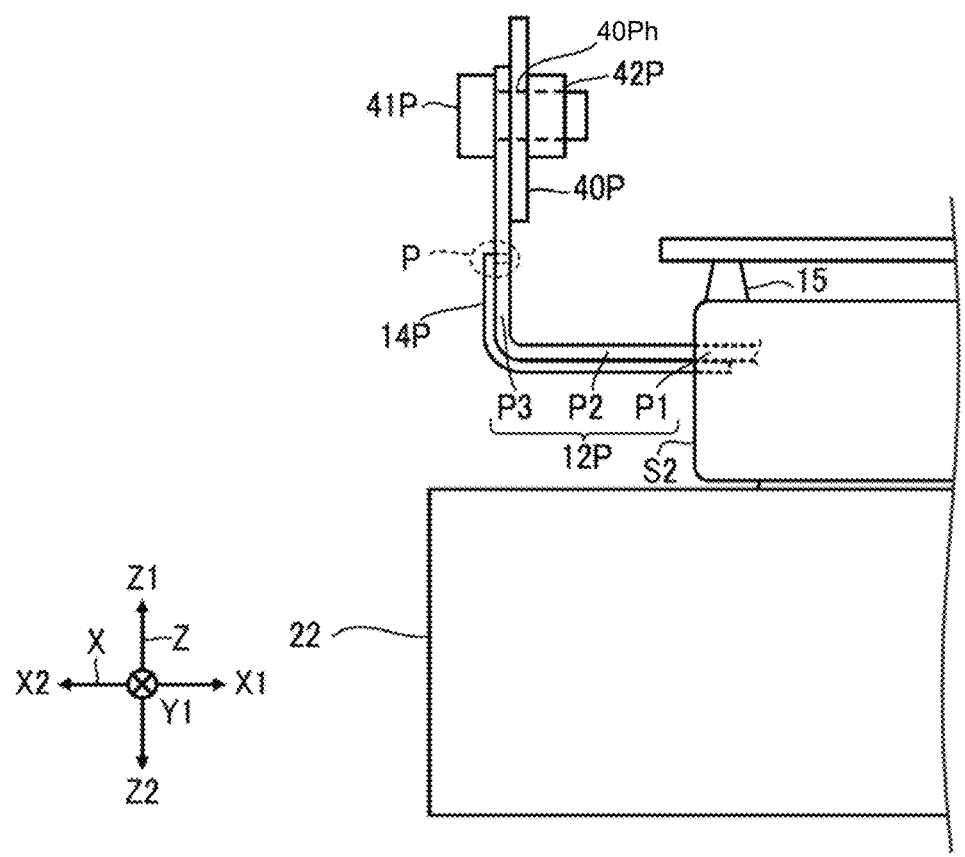
FIG. 9A is a side view illustrating Configuration Example 1 to fix tan insulating member 14P to a main current terminal 12P.

Next, another Configuration Example 1 to fix the insulating member 14P to the main current terminal 12P will be described. FIG. 9A is a side view illustrating another Configuration Example 1 to fix the insulating member 14P to the main current terminal 12P. As illustrated in FIG. 9A, the insulating member 14P is fixed to the main current terminal 12P at a fixing point P different from the point where the main current terminal 12P is fixed to the busbar 40P. The main current terminal 12P and the busbar 40P are fixed together by using the bolt 41P and the nut 42P that are described above. The insulating member 14P is made of, for example, insulating paper similarly to in the first embodiment.

Figure 9B:
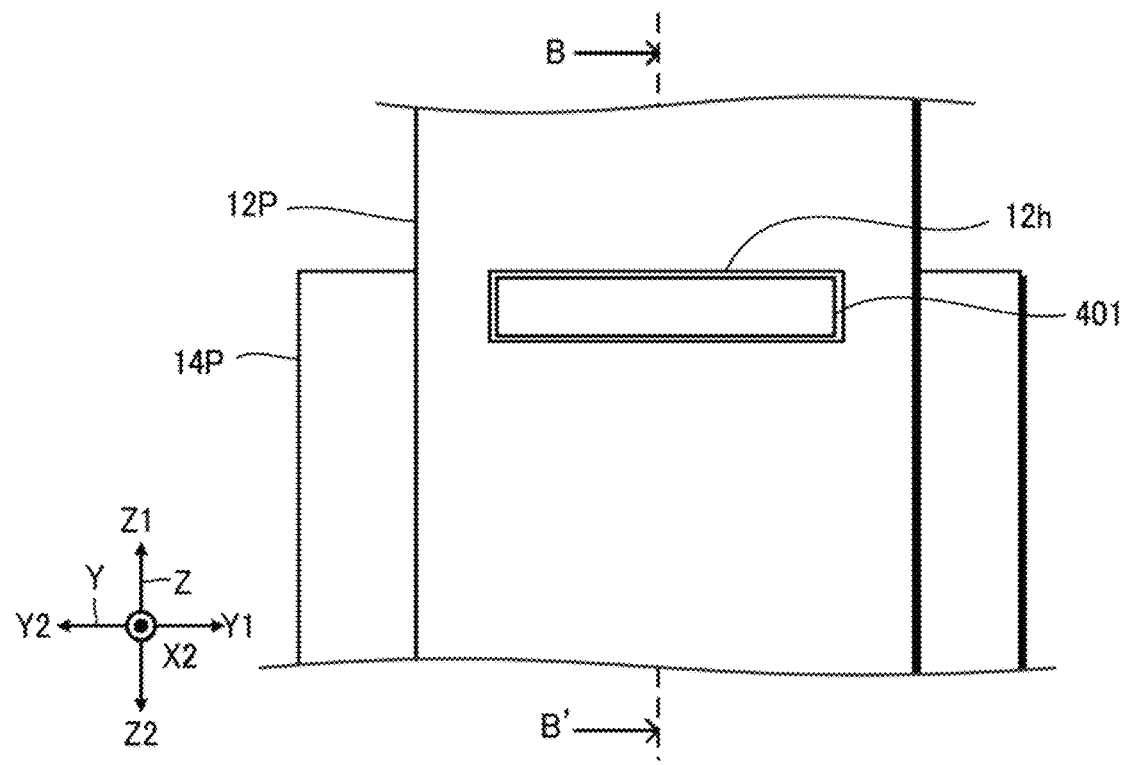
FIG. 9B is a side view of a fixing point P illustrated in FIG. 9A when the fixing point P is viewed from the side in an X2 direction.
Figure 9C:
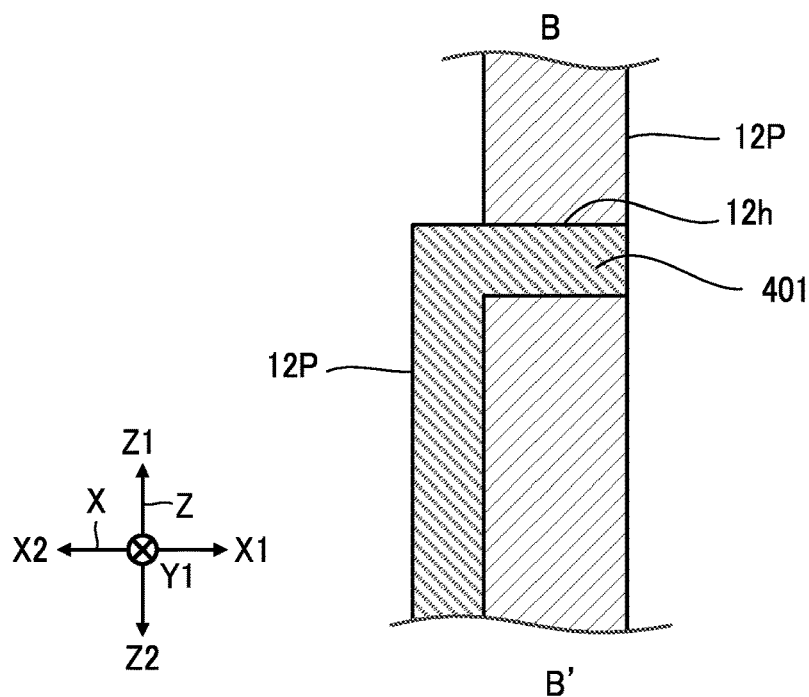
FIG. 9C is a cross-sectional view of the fixing point P taken along line B-B' illustrated in FIG. 9B.

FIG. 9B is a side view of the fixing point P illustrated in FIG. 9A when the fixing point P is viewed from the side in the X2 direction. FIG. 9C is a cross-sectional view of the fixing point P taken along line B-B' illustrated in FIG. 9B. As illustrated in FIGS. 9B and 9C, an opening 12*h* is provided on the third portion P3 of the main current terminal 12P. The opening 12*h* has a rectangular shape in side view. In contrast, the insulating member 14P includes a projecting portion 401 protruding toward the X1 direction from the contact face of the insulating member 14P with the main current terminal 12P. In this example, the projecting portion 401 has a cuboid shape. The projecting portion 401 of the insulating member 14P is inserted into the opening 12*h*. With this insertion, the insulating member 14P is fixed to the main current terminal 12P. In this example, the height from the contact face of the insulating member 14P with the main current terminal 12P to the end portion of the projecting portion 401 is approximately equal to the thickness of the main current terminal 12P. However, the height of the projecting portion 401 may be equal to, or greater than, the thickness of the main current terminal 12P. In this case, the projecting portion 401 partially protrudes from the opening 12*h* illustrated in FIG. 9B toward the X1 direction, and the protruding portion of the projecting portion 401 may be bent. The insulating member 14P may be cut with two slits at its end portion, and the slit portion may be bent toward the X1 direction to form the projecting portion 401.

In this manner, in Configuration Example 1, the insulating member 14P and the main current terminal 12P can be fixed together by inserting the insulating member 14P into the opening 12*h*. Therefore, in Configuration Example 1, it is sufficient for the opening 12*h* to be formed on the main current terminal 12P, and for the projecting portion 401 to be provided at the end portion of the insulating member 14P. Consequently, the insulation properties improve without the need for significant modification of the existing structure.

Figure 10A:
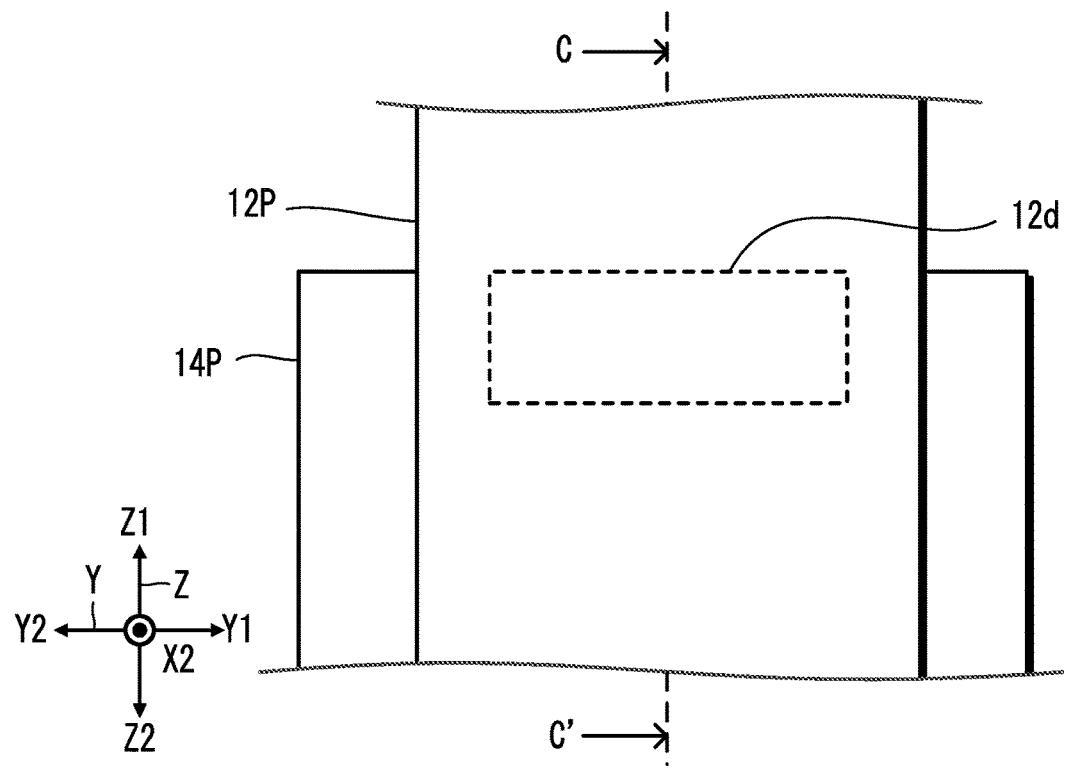
FIG. 10A is a side view of the fixing point P illustrated in FIG. 9A, to which Configuration Example 2 is applied, when the fixing point P is viewed from the side in the X2 direction.
Figure 10B:
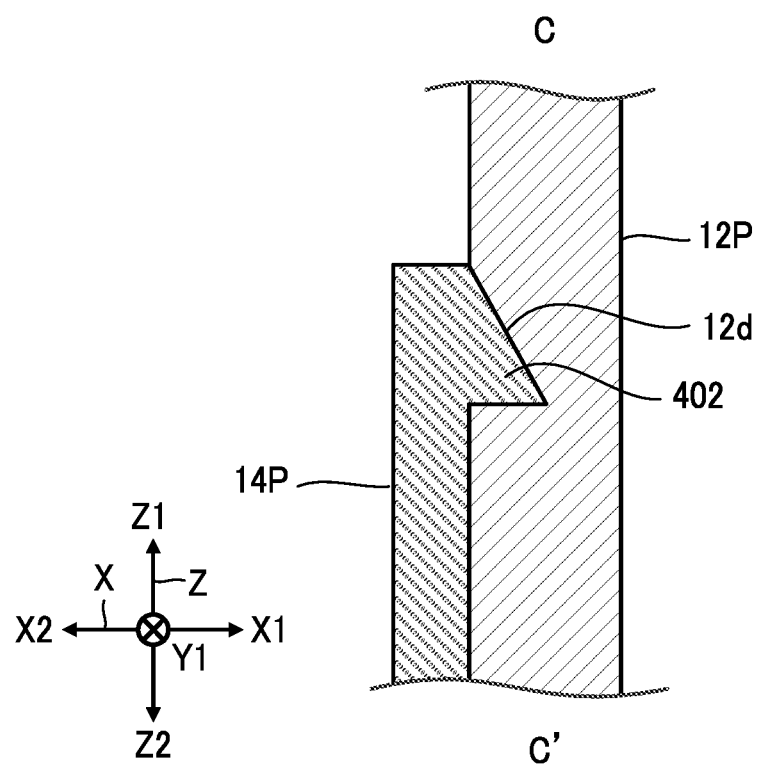
FIG. 10B is a cross-sectional view of the fixing point P taken along line C-C' illustrated in FIG. 10A.

Next, yet another Configuration Example 2 will be described. In Configuration Example 2, the fixing point P is different from the point at which the main current terminal 12P is fixed to the busbar 40P, as also described in Configuration Example 1 illustrated in FIG. 9A. FIG. 10A is a side view of the fixing point P illustrated in FIG. 9A, to which Configuration Example 2 is applied, when the fixing point P is viewed from the side in the X2 direction. FIG. 10B is a cross-sectional view of the fixing point P taken along line C-C' illustrated in FIG. 10A. As illustrated in FIGS. 10A and 10B, a recessed portion 12*d* is provided on the third portion P3 of the main current terminal 12P. The outer edge of the recessed portion 12*d* has a rectangular shape in side view. In contrast, the insulating member 14P includes a protruding portion 402 protruding toward the X1 direction from the contact face of the insulating member 14P with the main current terminal 12P. In this example, the protruding portion 402 has a claw-like shape. The recessed portion 12*d* of the main current terminal 12P connects with the protruding portion 402 of the insulating member 14P by inserting the protruding portion 402 into the recessed portion 12*d*. Although the insulating member 14P may be provided with a recessed portion, the main current terminal 12P may be provided with a protruding portion, and then the protruding portion of the main current terminal 12P may be fitted into the recessed portion of the insulating member 14P to connect the insulating member 14P with the main current terminal 12P.

In Configuration Example 2, the insulating member 14P and the main current terminal 12P can be fixed together by fitting the protruding portion 402 into the recessed portion 12*d* in the manner as described above. Therefore, in Configuration Example 2, it is sufficient for the recessed portion 12*d* to be formed on the main current terminal 12P, and for the protruding portion 402 to be provided at the end portion of the insulating member 14P. Consequently, the insulation properties improve without the need for significant modification of the existing structure.

In this embodiment, the bolt 41P and the nut 42P are used to fix the main current terminal 12P to the bus bar 40P, but it is not limited thereto. For example, the main current terminal 12P may be directly joined to the busbar 40P by spot welding using laser. Productivity is enhanced. The same applies to the fixing of the main current terminal 12N to the busbar 40N.

3. Third Embodiment

In the first and second embodiments described above, the insulating members 14P, 14M, and 14N are provided on the second sides 12D of the main current terminals 12P, 12M, and 12N, respectively, to ensure insulation between the cooler 21 and the main current terminals 12P, 12M, and 12N, or insulation between the cooler 22 and the main current terminals 12P, 12M, and 12N. In contrast, a semiconductor apparatus 1C according to a third embodiment is different from the semiconductor apparatus 1A and 1B in that an insulating member 100 is provided on a face of a cooler 23 in contact with the bottom face D. Differences between the semiconductor apparatus 1C and the semiconductor apparatus 1A and 1B will be mainly described below.

Figure 11:
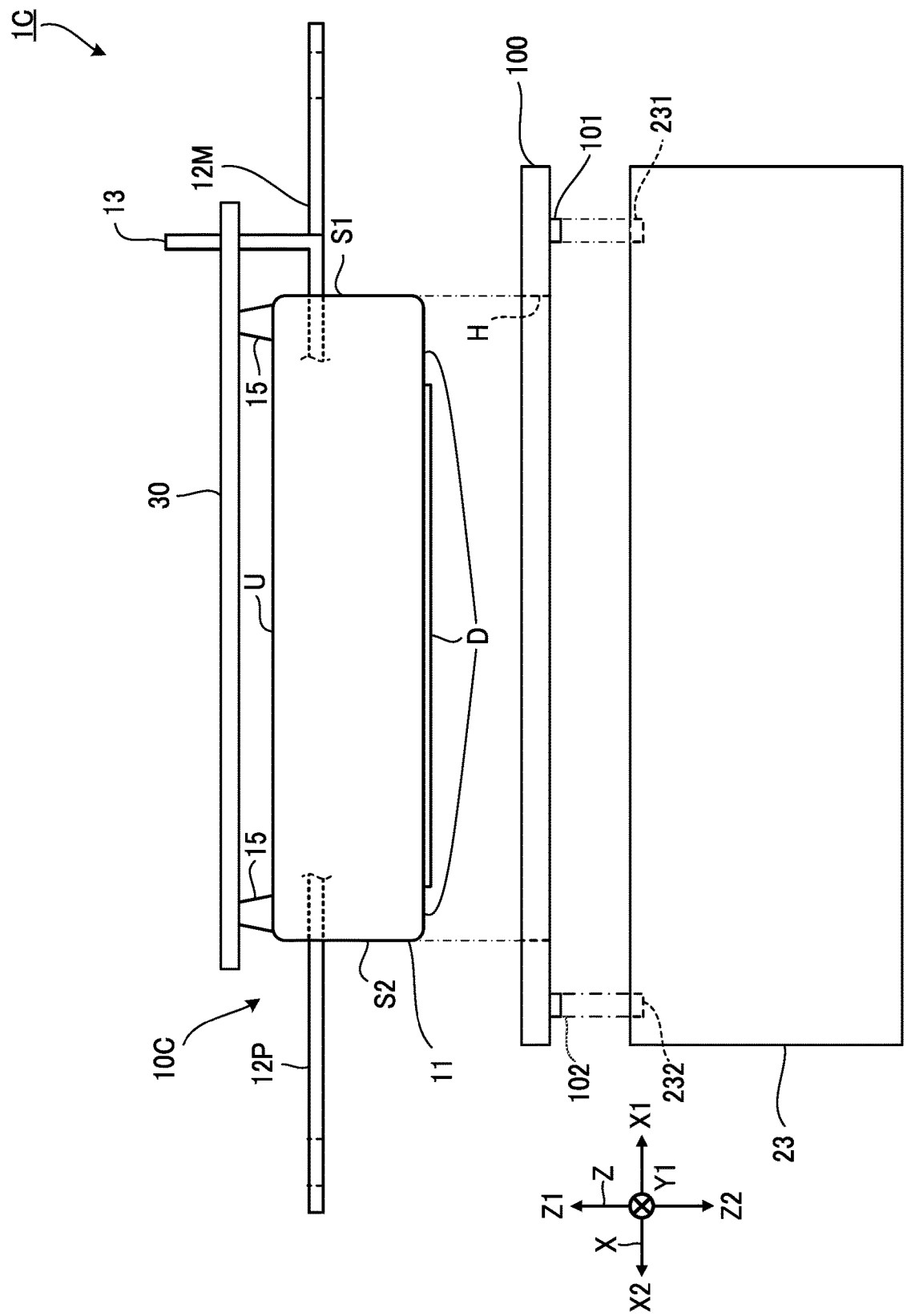
FIG. 11 is an exploded side view illustrating a configuration example of a semiconductor apparatus 1C according to a third embodiment of the present disclosure.
Figure 12:
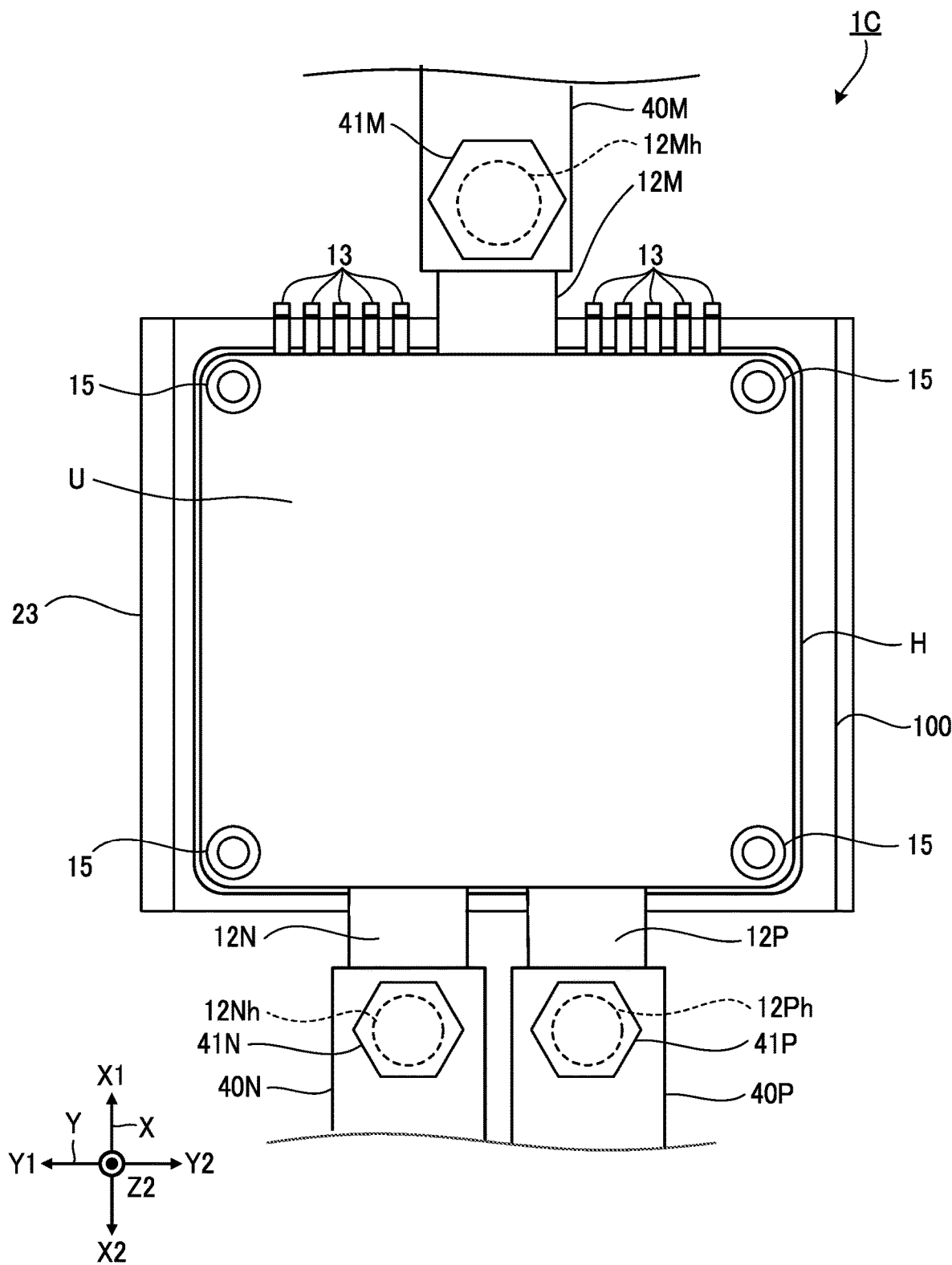
FIG. 12 is a plan view of the semiconductor apparatus 1C with the control board 30 removed therefrom.

FIG. 11 is an exploded side view illustrating a configuration example of the semiconductor apparatus 1C according to the third embodiment of the present disclosure. FIG. 11 omits illustrations of the busbars 40M and 40P. FIG. 12 is a plan view of the semiconductor apparatus 1C with the control board 30 removed therefrom. The semiconductor apparatus 1C has a configuration substantially the same as that of the semiconductor apparatus 1A according to the first embodiment, except for the following points. The insulating members 14P, 14M, and 14N are eliminated. The recessed portion 11*a* is not formed on the side face S1 of the main body 11. The insulating member 100 is provided. The cooler 23 is used instead of the cooler 21.

The insulating member 100 illustrated in FIG. 11 has a flat plate-like shape and includes an opening H at the central portion. The insulating member 100 includes a lower face in contact with the cooler 23 and an upper face on an opposite side of the lower face. The lower face of the insulating member 100 is provided with projecting portions 101 and 102 protruding toward the Z2 direction. The projecting portions 101 and 102 are used for positioning the insulating member 100 to be attached to the cooler 23.

The cooler 23 include recessed portions 231 and 232 that are on the contact face of the cooler 23. The contact face is to be contacted with the insulating member 100. The recessed portions 231 and 232 are in a one-to-one correspondence with the projecting portions 101 and 102. Each of the recessed portions 231 and 232 has a flat bottom face. The recessed portions 231 and 232 have a depth less than the height of the projecting portions 101 and 102. Therefore, when the insulating member 100 is assembled with the cooler 23 such that the projecting portions 101 and 102 are inserted into the recessed portions 231 and 232, the contact face of the cooler 23 comes into contact with the lower face of the insulating member 100.

In the process of assembling the semiconductor apparatus 1C, first, the insulating member 100 is fixed to the cooler 23 by using an adhesive. Second, an adhesive is poured into the opening H. Third, the main body 11 is placed onto the opening H to fix the main body 11 to the cooler 23. As illustrated in FIG. 12, when the main body 11 is viewed in plan, the main current terminals 12P, 12M, and 12N overlap the insulating member 100 in a region in which the main current terminals 12P, 12M, and 12N overlap the cooler 23. That is, the insulating member 100 is positioned between the cooler 23 and the main current terminals 12P, 12M, and 12N. Thus, insulation between the cooler 23 and the main current terminals 12P, 12M, and 12N can be ensured. Furthermore, since the main body 11 is accommodated in the opening H, the insulating member 100 can position the cooler 23 and the main body 11. In this manner, the insulating member 100 has combined functions of ensuring the insulation properties and positioning. This improves the insulation properties while simplifying the configuration of the semiconductor apparatus 1C.

4. Modifications

The present disclosure is not limited to the first to third embodiments described above, and various modifications described below can be made. The respective embodiments and the respective modifications can be combined with one another as appropriate.

(1) First Modification

In the first and second embodiments described above, the insulating member 14P corresponding to the main current terminal 12P, and the insulating member 14N corresponding to the main current terminal 12N are provided independently from each other. However, the present disclosure is not limited thereto.

Figure 13:
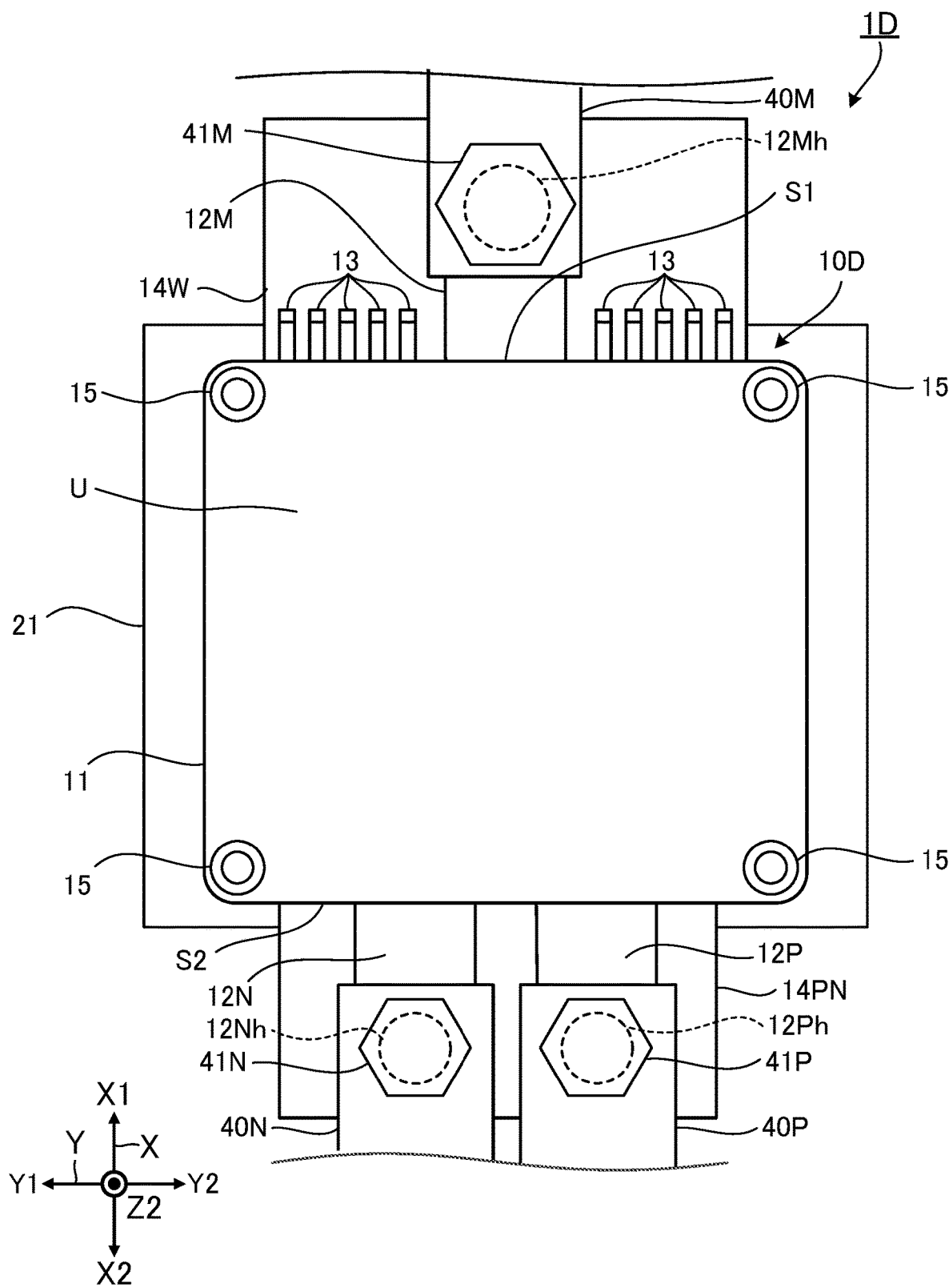
FIG. 13 is a plan view illustrating a configuration example of a semiconductor apparatus 1D according to a first modification.

FIG. 13 is a plan view of a semiconductor apparatus 1D according to a first modification. The semiconductor apparatus 1D is different from the semiconductor apparatus 1A according to the first embodiment in that a semiconductor module 10D is used instead of the semiconductor module 10A.

The semiconductor module 10D has a configuration that is substantially the same as that of the semiconductor module 10A according to the first embodiment, except for the following points. An insulating member 14PN is used instead of the insulating members 14P and 14N. An insulating member 14\V is used instead of the insulating member 14M.

The main current terminal 12N illustrated in FIG. 13 is connected to the emitter electrode E1 of the first RC-IGBT accommodated in the main body 11 (see FIG. 4). The main current terminal 12P is connected to the collector electrode of the second RC-IGBT accommodated in the main body 11. The first RC-IGBT is an example of the first power semiconductor element. The second RC-IGBT is an example of the second power semiconductor element. The emitter electrode E1 and the collector electrode are an example of the main current electrodes.

The main current terminal 12N includes a first face, and a second face on an opposite side of the first face. The second face is closer to the cooler 21 than the first face. The main current terminal 12P includes a third face, and a fourth face on an opposite side of the third face. The fourth face is closer to the cooler 21 than the third face.

The main current terminals 12N and 12P protrude outward from the side face S2 of the main body 11. The first face of the main current terminal 12N and the third face of the main current terminal 12P are not covered by the insulating member 14PN. Heat generated in the first RC-IGBT is dissipated from the first face of the main current terminal 12N. Heat generated in the second RC-IGBT is dissipated from the third face of the main current terminal 12P.

The end portion of the insulating member 14PN is accommodated in a recessed portion provided on the side face S2. The insulating member 14PN protrudes from the side face S2 of the main body 11 toward the X2 direction. A portion of the insulating member 14PN is positioned between the cooler 21 and the second face of the main current terminal 12N, while being positioned between the cooler 21 and the fourth face of the main current terminal 12P. When the insulating member 14PN is viewed in plan, a portion of the main current terminal 12P protruding from the main body 11, and a portion of the main current terminal 12N protruding from the main body 11 overlap a portion of the insulating member 14PN protruding from the main body 11. Therefore, the cooler 21 can be adequately insulated from the main current terminals 12P and 12N by using one insulating member 14PN.

An end portion of the insulating member 14W is accommodated in a recessed portion provided on the side face S1. The insulating member 14W protrudes from the side face S1 of the main body 11 toward the X1 direction. When the insulating member 14W is viewed in plan, a portion of the main current terminal 12M, which protrudes from the main body 11, and portions of the control terminals 13, which protrude from the main body 11, overlap a portion of the insulating member 14W protruding from the main body 11. Therefore, the cooler 21 can be adequately insulated from the main current terminal 12M and a plurality of control terminals 13 by using one insulating member 14W.

As described above, the semiconductor apparatus 1D uses one insulating member 14PN to insulate the cooler 21 from two main current terminals 12P and 12N, so that the configuration of the semiconductor apparatus 1D is simplified. The semiconductor apparatus 1D uses one insulating member 14W to insulate the cooler 21 from the main current terminal 12M and the plurality of control terminals 13, so that the configuration of the semiconductor apparatus 1D is simplified.

(2) Second Modification

In the embodiments and the first modification described above, one cooler is provided to a single semiconductor module. However, the present disclosure is not limited thereto, and one cooler may be provided to a plurality of semiconductor modules. FIG. 14 is a plan view illustrating a configuration example of a semiconductor apparatus 1E according to a second modification. For example, the semiconductor apparatus 1E is employed in an inverter that drives a three-phase AC electric motor used in an electric automobile or other types of vehicles.

As illustrated in FIG. 14, the semiconductor apparatus 1E includes semiconductor modules M1, M2, and M3, a cooler 24, a U-phase busbar 40M_U, a V-phase busbar 40M_V, a W-phase busbar 40M_W, the busbars 40N and 40P, and an insulating sheet 200. The insulating sheet 200 is an example of an insulating member.

Each of the semiconductor modules M1, M2, and M3 is of an identical configuration to the semiconductor module 10D according to the first modification. The main current terminals 12M in the semiconductor modules M1, M2, and M3 are connected to the busbars 40M_U, 40M_V, and 40M_W, respectively, in one-to-one correspondence.

The busbar 40N is connected to the main current terminals 12N in the semiconductor modules M1, M2, and M3. The busbar 40P is connected to the main current terminals 12P in the semiconductor modules M1, M2, and M3. The insulating sheet 200 is located between the busbar 40N and the busbar 40P. The insulating sheet 200 insulates the busbar 40N and the busbar 40P from each other. The semiconductor modules M1, M2, and M3 are fixed to the cooler 24 by using an adhesive.

The semiconductor apparatus 1E includes the busbars 40N and 40P to be used in common in three semiconductor modules M1 to M3, and includes the cooler 24 to be used in common in the three semiconductor modules M1 to M3. Therefore, the configuration of the semiconductor apparatus 1E can be further simplified compared to the case in which a semiconductor apparatus uses separate constituent elements.

DESCRIPTION OF REFERENCE SIGNS 1A, 1B, 1C, 1D, 1E . . . semiconductor apparatus, 10A, 10D, M1, M2, M3 . . . semiconductor module, 11 . . . main body, 11a, 11b . . . recessed portion, 12U . . . first face, 12D . . . second face, 12M, 12N, 12P . . . main current terminal, 13 . . . control terminal, 12Mh, 12Ph . . . first opening, 12h . . . opening, 14W, 14M, 14N, 14P, 14PN . . . insulating member, 14Mh, 14Ph . . . second opening, 21, 22, 23, 24 . . . cooler, 40M, 40M_U, 40M_V, 40M_W, 40N, 40P . . . busbar, 40Mh, 40Ph . . . through-hole, D . . . bottom face, P1 . . . first portion, P2 . . . second portion, P3 . . . third portion, S1, S2 . . . side face.

What is claimed is:

1. A semiconductor module comprising:
a first power semiconductor element that includes a first main current electrode;
a main body configured to accommodate therein the first power semiconductor element; and
a first main current terminal connectable to the first main current electrode,
wherein the main body includes:
a top face;
a side face that connects to the top face;
a bottom face on an opposite side of the top face, the bottom face being fixable to a cooler; and
a recessed portion that is on the side face, and is configured to accommodate therein an end portion of an insulating member,
wherein the first main current terminal is configured to protrude from the side face of the main body, and includes:
a first face; and
a second face on an opposite side of the first face,
wherein the second face is closer to the bottom face than the first face on the side face,
wherein the recessed portion is on the side face between the bottom face and the second face and is recessed from the side face toward the inside of the main body, the recessed portion is at a position apart from the bottom face, and the recessed portion includes a bottom edge, and
wherein the first main current terminal includes, at a portion protruding from the side face, a fixing portion configured to fix the insulating member.

2. The semiconductor module according to claim 1, further comprising a control terminal,
wherein a portion of the first main current terminal, the portion protruding from the side face, overlaps a part or whole of a portion of the insulating member positioned outside the main body, in plan view from a direction vertical to the top face, and
wherein a portion of the control terminal, the portion protruding from the side face, does not overlap the insulating member at all in the plan view.

3. The semiconductor module according to claim 1, wherein the first main current terminal includes:
a first portion configured to extend into the main body;
a second portion configured to be connected with the first portion and to protrude outward from the main body; and
a third portion configured to form an angle relative to the second portion in a direction away from the cooler, and
wherein the third portion includes the fixing portion.

4. The semiconductor module according to claim 1,
wherein the fixing portion is an opening provided on the first main current terminal, and
wherein the insulating member is inserted into the opening.

5. The semiconductor module according to claim 1,
wherein the fixing portion is a first opening provided on the first main current terminal,
wherein the insulating member is provided with a second opening, and
wherein the first main current terminal and the insulating member are configured to be fixed together by a screw that is inserted through the first opening and the second opening.

6. The semiconductor module according to claim 5,
wherein the first main current terminal is positioned between the insulating member and a busbar having a through hole, and
wherein the busbar and the first face of the first main current terminal are configured to be electrically connected by the screw that is inserted through the through hole, the first opening, and the second opening.

7. The semiconductor module according to claim 1,
wherein the fixing portion of the first main current terminal is either one of a recessed portion and a protruding portion,
wherein the insulating member is provided with the other one of a recessed portion and a protruding portion, and
wherein either one of the recessed portion and the protruding portion of the first main current terminal is configured to be connected with the other one of the recessed portion and the protruding portion of the insulating member.

8. The semiconductor module according to claim 1,
wherein the fixing portion is located at a position at which the fixing portion does not overlap the cooler, in plan view, from a direction vertical to the top face.

9. The semiconductor module according to claim 1,
wherein the cooler overlaps a portion of the first main current terminal, the portion protruding from the side face, in plan view from a direction vertical to the top face,
wherein a region in which the cooler overlaps the portion entirely overlaps the insulating member.

10. The semiconductor module according to claim 1,
wherein the insulating member entirely overlaps the cooler, in plan view, from a direction vertical to the top face.

11. The semiconductor module according to claim 1, further comprising:
a second power semiconductor element that includes a second main current electrode; and
a second main current terminal connectable to the second main current electrode,
wherein the main body is configured to further accommodate therein the second power semiconductor element,
wherein the second main current terminal is configured to protrude outward from the side face of the main body, and includes:
a third face; and
a fourth face,
wherein the third face is on an opposite side of the fourth face, and is not covered by the insulating member,
wherein the fourth face is closer to the cooler than the third face, and
wherein at least a portion of the insulating member is positioned between the fourth face and the cooler.

12. The semiconductor module according to claim 1, wherein the insulating member is any one of an insulating paper, an insulating sheet, and an insulating plate.

13. The semiconductor module according to claim 1, wherein the first power semiconductor element is a Reverse Conducting Insulated Gate Bipolar Transistor (RC-IGBT).

14. A semiconductor module comprising:
a first power semiconductor element that includes a first main current electrode;
a main body configured to accommodate therein the first power semiconductor element;
a first main current terminal connectable to the first main current electrode; and
an insulating member,
wherein the main body includes:
a top face;
a side face that connects to the top face; and
a bottom face on an opposite side of the top face, the bottom face being fixable to a cooler,
wherein the first main current terminal is configured to protrude from the side face, and includes:
a first face; and
a second face on an opposite side of the first face,
wherein the first face is not covered by the insulating member,
wherein the second face is closer to the bottom face than the first face on the side face,
wherein a portion of the insulating member being closest to the side face is between the bottom face and the second face, and is at a position apart from the bottom face, in side view from a direction perpendicular to the side face, and
wherein the insulating member includes a protruding portion outside of the main body, the protruding portion having a bottom surface facing the cooler, and the entire bottom surface of the protruding portion of the insulating member facing the cooler being exposed.

15. The semiconductor module according to claim 14, further comprising a control terminal,
wherein a portion of the first main current terminal, the portion protruding from the side face, overlaps a part or whole of a portion of the insulating member positioned outside the main body, in plan view from a direction vertical to the top face, and
wherein a portion of the control terminal, the portion protruding from the side face, does not overlap the insulating member at all in the plan view.

16. The semiconductor module according to claim 14, further comprising:
a second power semiconductor element that includes a second main current electrode; and
a second main current terminal connectable to the second main current electrode,
wherein the main body is configured to further accommodate therein the second power semiconductor element,
wherein the second main current terminal is configured to protrude outward from the side face of the main body, and includes:
a third face; and
a fourth face,
wherein the third face is on an opposite side of the fourth face, and is not covered by the insulating member,
wherein the fourth face is closer to the cooler than the third face, and
wherein at least a portion of the insulating member is positioned between the fourth face and the cooler.

17. The semiconductor module according to claim 14, wherein the insulating member is any one of an insulating paper, an insulating sheet, and an insulating plate.

18. The semiconductor module according to claim 14, wherein the first power semiconductor element is a Reverse Conducting Insulated Gate Bipolar Transistor (RC-IGBT).

19. A semiconductor apparatus comprising:
a semiconductor module; and
a cooler,
wherein the semiconductor module includes:
a first power semiconductor element that includes a first main current electrode;
a main body configured to accommodate therein the first power semiconductor element; and
a first main current terminal connectable to the first main current electrode,
wherein the main body includes:
a top face;
a side face that connects to the top face;
a bottom face on an opposite side of the top face, the bottom face being fixable to the cooler; and
a recessed portion that is on the side face, and is configured to accommodate therein an end portion of an insulating member,
wherein the first main current terminal is configured to protrude from the side face of the main body, and includes:
a first face; and
a second face on an opposite side of the first face,
wherein the second face is closer to the bottom face than the first face on the side face,
wherein the recessed portion is on the side face between the bottom face and the second face and is recessed from the side face toward the inside of the main body, the recessed portion is at a position apart from the bottom face, and the recessed portion includes a bottom edge, and
wherein the first main current terminal includes, at a portion protruding from the side face, a fixing portion configured to fix the insulating member.

* * * * *